(12) United States Patent
Lee et al.

(10) Patent No.: US 12,218,199 B2
(45) Date of Patent: *Feb. 4, 2025

(54) TRANSISTOR GATE STRUCTURES AND METHODS OF FORMING THE SAME

(71) Applicant: Taiwan Semiconductor Manufacturing Co., Ltd., Hsinchu (TW)

(72) Inventors: Hsin-Yi Lee, Hsinchu (TW); Jia-Ming Lin, Hsinchu (TW); Chi On Chui, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/333,981

(22) Filed: Jun. 13, 2023

(65) Prior Publication Data

US 2023/0326967 A1 Oct. 12, 2023

Related U.S. Application Data

(63) Continuation of application No. 17/220,335, filed on Apr. 1, 2021, now Pat. No. 11,715,762.

(Continued)

(51) Int. Cl.
*H01L 29/06* (2006.01)
*H01L 21/265* (2006.01)
*H01L 27/092* (2006.01)

(52) U.S. Cl.
CPC ...... *H01L 29/0673* (2013.01); *H01L 21/2654* (2013.01); *H01L 27/0924* (2013.01)

(58) Field of Classification Search
CPC ....... H01L 21/02603; H01L 21/823431; H01L 21/823821; H01L 21/845; H01L 27/0886;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

KR 20160129664 A 11/2016
KR 20200037083 A 4/2020
(Continued)

*Primary Examiner* — David C Spalla
(74) *Attorney, Agent, or Firm* — Slater Matsil, LLP

(57) ABSTRACT

In an embodiment, a device includes: a first nanostructure; a second nanostructure; a gate dielectric around the first nanostructure and the second nanostructure, the gate dielectric including dielectric materials; and a gate electrode including: a work function tuning layer on the gate dielectric, the work function tuning layer including a pure work function metal, the pure work function metal of the work function tuning layer and the dielectric materials of the gate dielectric completely filling a region between the first nanostructure and the second nanostructure, the pure work function metal having a composition of greater than 95 at. % metals; an adhesion layer on the work function tuning layer; and a fill layer on the adhesion layer.

20 Claims, 22 Drawing Sheets

Related U.S. Application Data

(60) Provisional application No. 63/142,557, filed on Jan. 28, 2021.

(58) Field of Classification Search
CPC ............. H01L 27/0924; H01L 27/1211; H01L 29/0665; H01L 29/0673; H01L 29/41791; H01L 29/66439; H01L 29/66795; H01L 29/775; H01L 29/785; H01L 29/7851; H01L 29/7853; H01L 29/7855; H01L 2029/7858
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,068,969 B2 | 9/2018 | Tung |
| 10,741,558 B2 | 8/2020 | Chiang et al. |
| 11,715,762 B2 * | 8/2023 | Lee .................. H01L 29/66439 257/288 |
| 2016/0225868 A1 * | 8/2016 | Kim .................... H01L 27/0886 |
| 2016/0322471 A1 | 11/2016 | JangJian et al. |
| 2019/0081152 A1 * | 3/2019 | Suh .................. H01L 29/66545 |
| 2019/0371912 A1 * | 12/2019 | Bao ................. H01L 21/823842 |
| 2020/0043808 A1 | 2/2020 | Bao et al. |
| 2020/0098882 A1 | 3/2020 | Lee et al. |
| 2020/0105902 A1 | 4/2020 | Ching et al. |

FOREIGN PATENT DOCUMENTS

| | | |
|---|---|---|
| TW | 201736249 A | 10/2017 |
| TW | 202013531 A | 4/2020 |

* cited by examiner

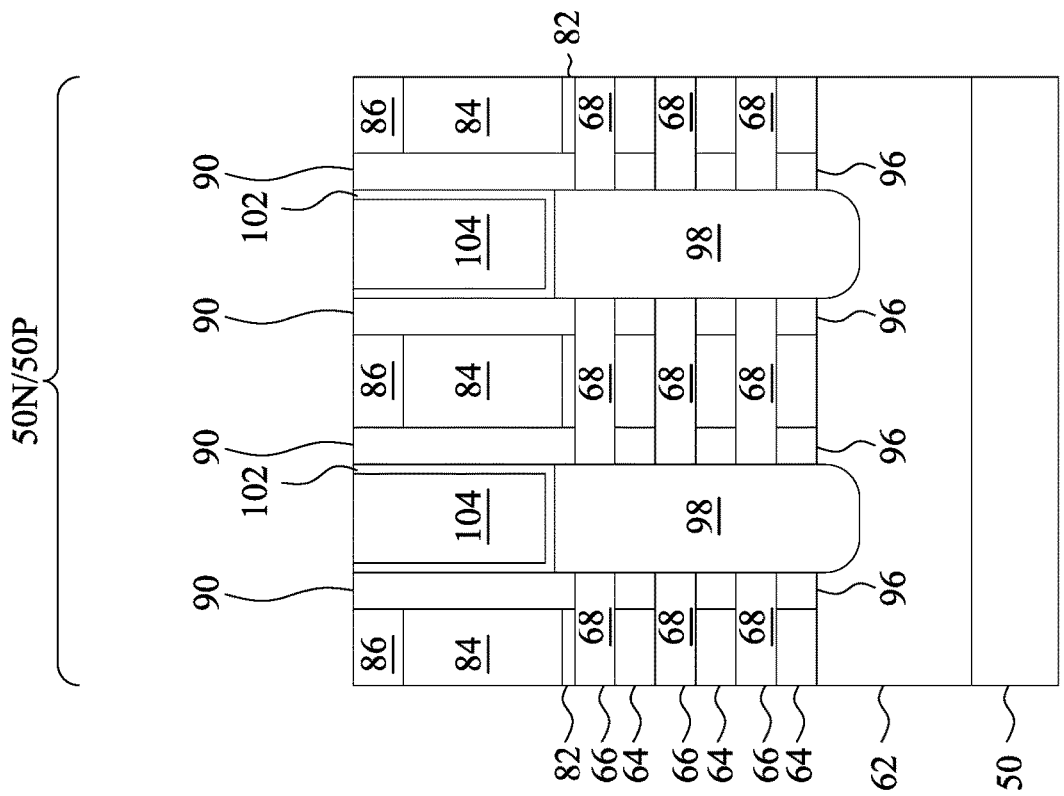
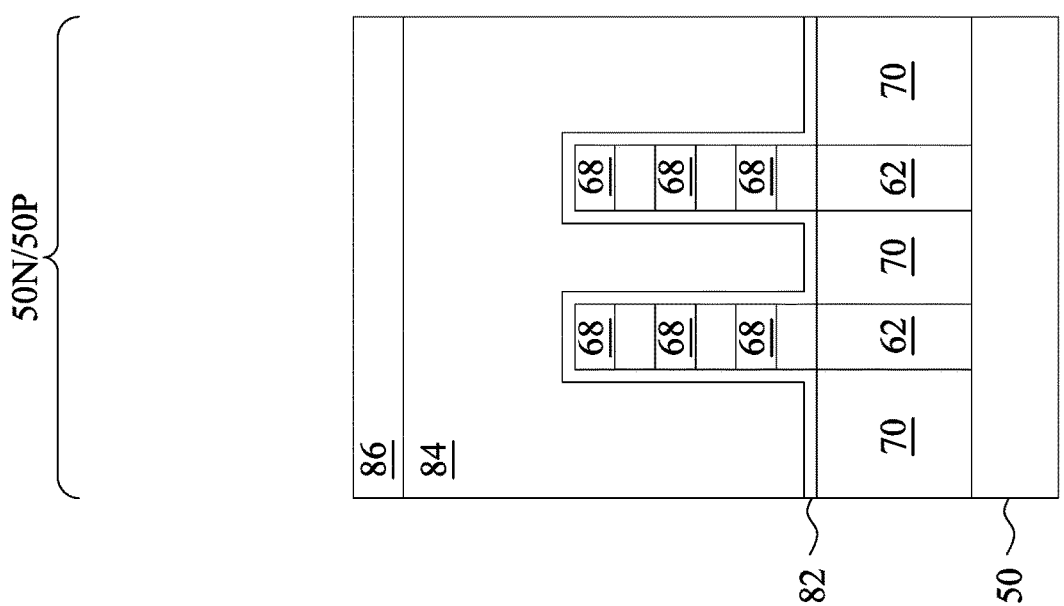
Fig. 11B
Fig. 11A

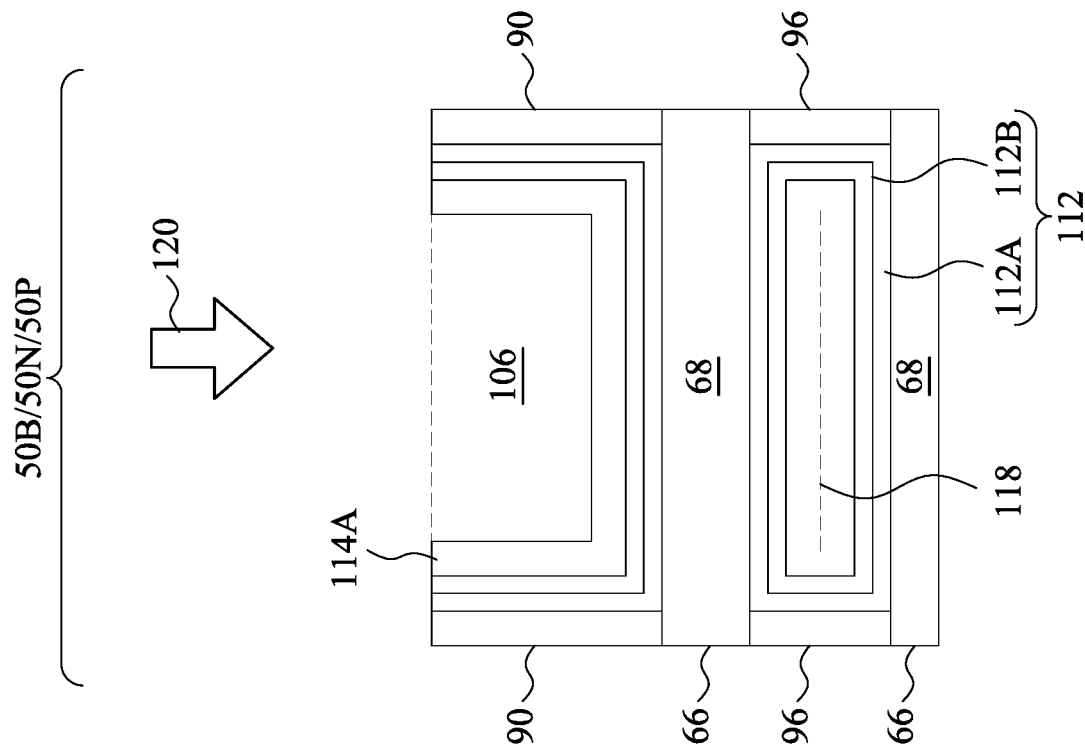
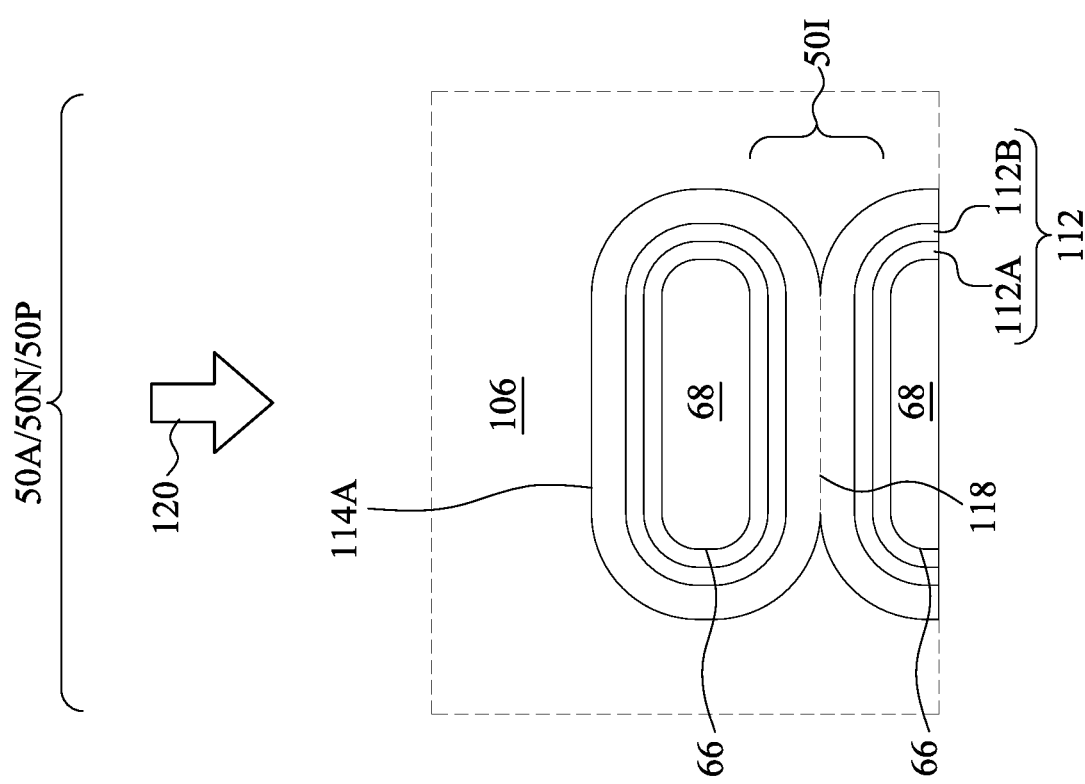
Fig. 15A
Fig. 15B

TRANSISTOR GATE STRUCTURES AND METHODS OF FORMING THE SAME

PRIORITY CLAIM AND CROSS-REFERENCE

This application is a continuation of U.S. patent application Ser. No. 17/220,335, filed on Apr. 1, 2021, entitled "Transistor Gate Structures and Methods of Forming the Same," which claims the benefit of U.S. Provisional Application No. 63/142,557, filed on Jan. 28, 2021, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7A, 7B, 8A, 8B, 9A, 9B, 9C, 9D, 10A, 10B, 11A, 11B, 12A, 12B, 13A, 13B, 14A, 14B, 15A, 15B, 16A, 16B, 17A, 17B, 18A, 18B, 19A, and 19B are views of intermediate stages in the manufacturing of nano-FETs, in accordance with some embodiments.

DETAILED DESCRIPTION

Figure 1:
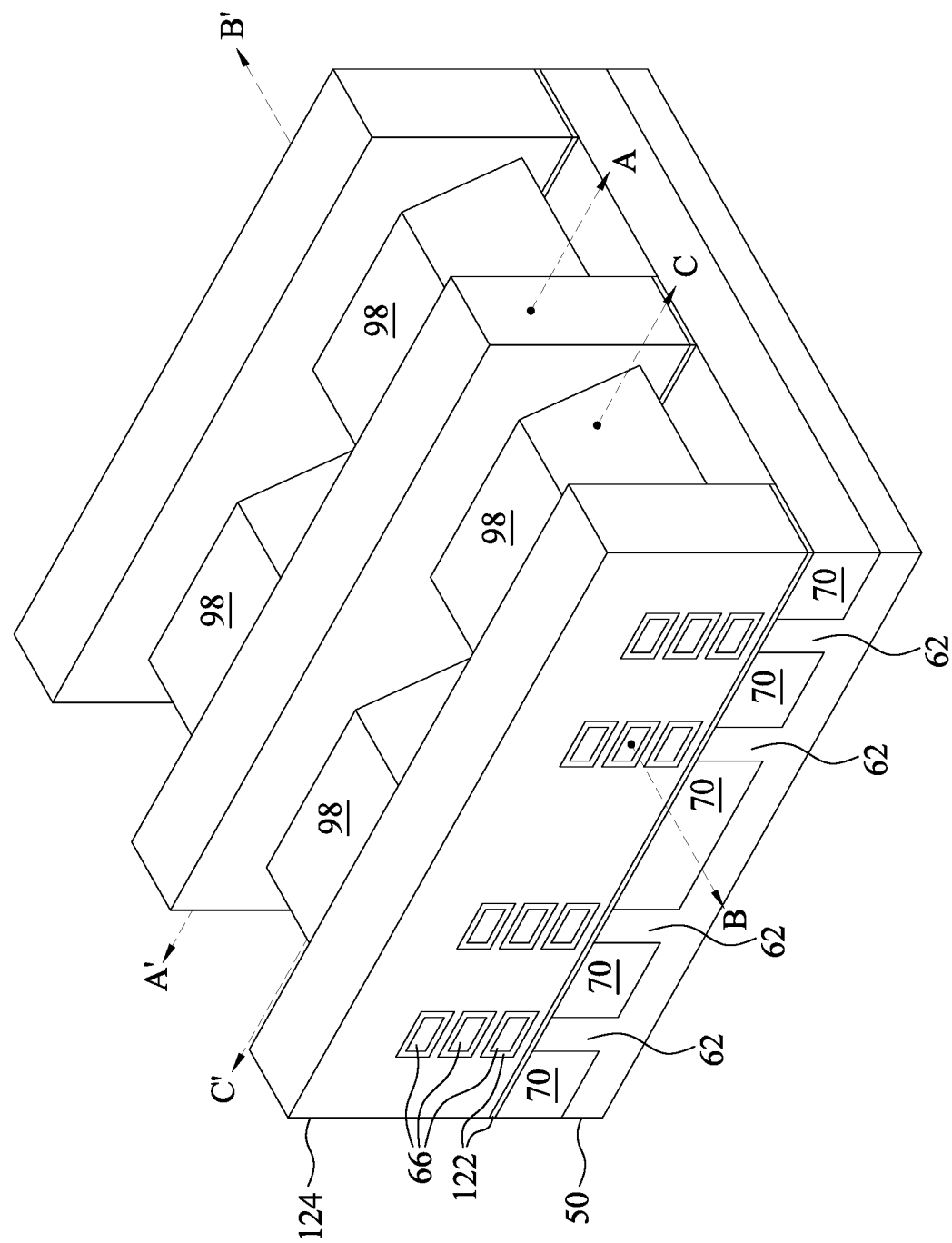
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, transistor gate structures are formed with work function tuning layers that are formed of pure work function metal(s). The pure work function metal(s) may be deposited with one of several deposition processes, and a purification treatment may optionally be performed to increase the purity of the metal of the work function tuning layers. Devices with work function tuning layers formed of pure work function metal(s) have work functions that are close to the edge of their energy band, allowing their threshold voltage to be decreased. Further, work function tuning layers formed of pure work function metal(s) have a low resistance. Device performance may thus be improved.

Embodiments are described in a particular context, a die including nano-FETs. Various embodiments may be applied, however, to dies including other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like), in accordance with some embodiments. FIG. 1 is a three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nanostructures 66 (e.g., nanosheets, nanowires, or the like) over fins 62 on a substrate 50 (e.g., a semiconductor substrate), with the nanostructures 66 acting as channel regions for the nano-FETs. The nanostructures 66 may include p-type nanostructures, n-type nanostructures, or a combination thereof. Isolation regions 70, such as shallow trench isolation (STI) regions, are disposed between adjacent fins 62, which may protrude above and from between adjacent isolation regions 70. Although the isolation regions 70 are described/illustrated as being separate from the substrate 50, as used herein, the term "substrate" may refer to the semiconductor substrate alone or a combination of the semiconductor substrate and the isolation regions. Additionally, although a bottom portion of the fins 62 are illustrated as being single, continuous materials with the substrate 50, the bottom portion of the fins 62 and/or the substrate 50 may include a single material or a plurality of materials. In this context, the fins 62 refer to the portion extending above and from between the adjacent isolation regions 70.

Gate dielectrics 122 are over top surfaces of the fins 62 and along top surfaces, sidewalls, and bottom surfaces of the nanostructures 66. Gate electrodes 124 are over the gate dielectrics 122. Epitaxial source/drain regions 98 are disposed on the fins 62 at opposing sides of the gate dielectrics 122 and the gate electrodes 124. The epitaxial source/drain regions 98 may be shared between various fins 62. For example, adjacent epitaxial source/drain regions 98 may be electrically connected, such as through coalescing the epitaxial source/drain regions 98 by epitaxial growth, or through coupling the epitaxial source/drain regions 98 with a same source/drain contact.

FIG. 1 further illustrates reference cross-sections that are used in later figures. Cross-section A-A' is along a longitudinal axis of a gate electrode 124 and in a direction, for example, perpendicular to a direction of current flow between the epitaxial source/drain regions 98 of a nano-FET. Cross-section B-B' is along a longitudinal axis of a nano-structure 66 and in a direction of, for example, a current flow between the epitaxial source/drain regions 98 of the nano-FET. Cross-section C-C' is parallel to cross-section A-A' and extends through epitaxial source/drain regions 98 of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

FIGS. 2-19B are views of intermediate stages in the manufacturing of nano-FETs, in accordance with some embodiments. FIGS. 2, 3, 4, 5, and 6 are three-dimensional views showing a similar three-dimensional view as FIG. 1. FIGS. 7A, 8A, 9A, 10A, 11A, 12A, 13A, 14A, 15A, 16A, 17A, 18A, and 19A illustrate reference cross-section A-A' illustrated in FIG. 1, except two fins are shown. FIGS. 7B, 8B, 9B, 10B, 11B, 12B, 13B, 14B, 15B, 16B, 17B, 18B, and 19B illustrate reference cross-section B-B' illustrated in FIG. 1. FIGS. 9C and 9D illustrate reference cross-section C-C' illustrated in FIG. 1, except two fins are shown.

Figure 2:
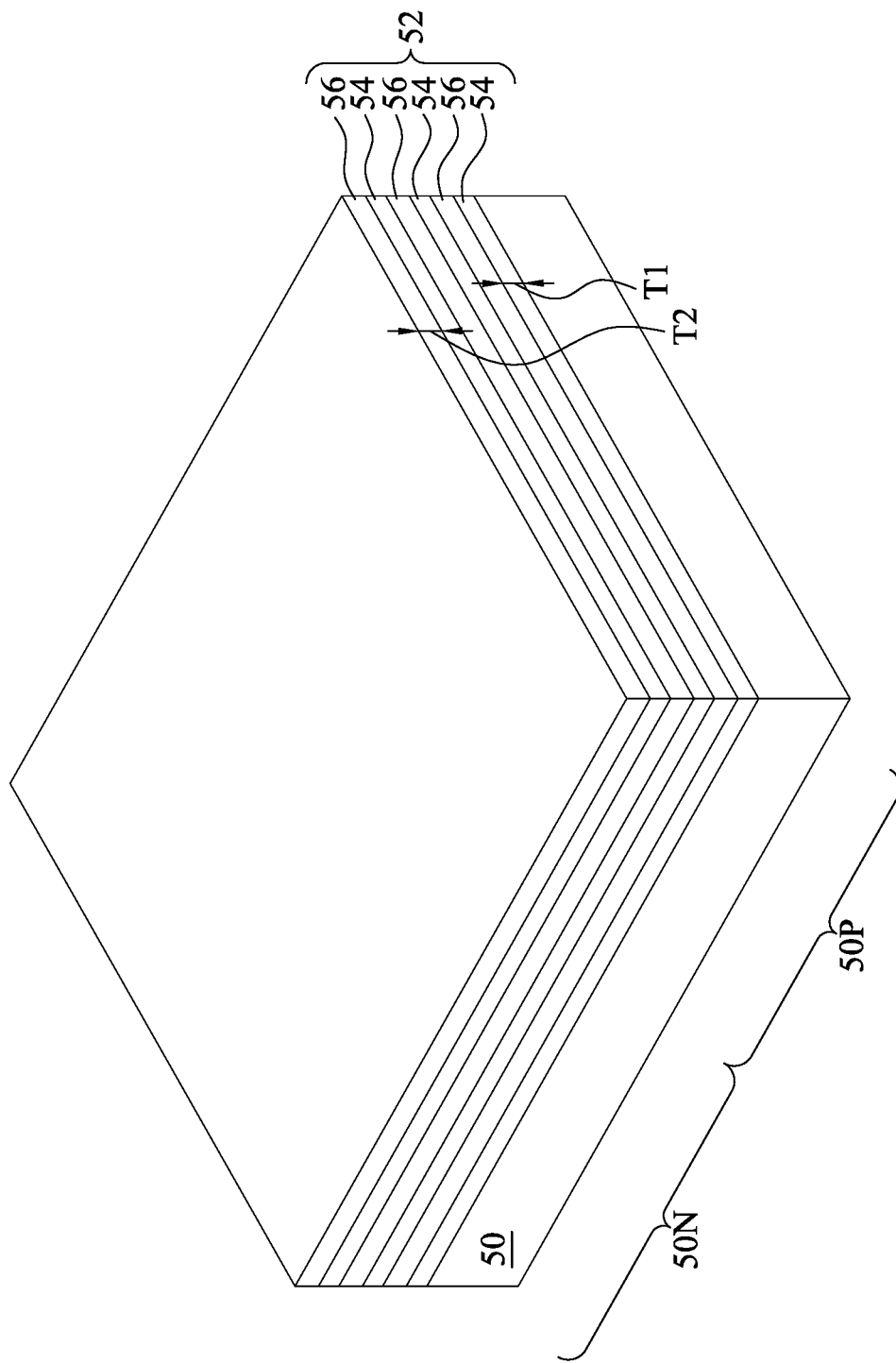

In FIG. 2, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or a n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has a n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or a n-type impurity. An anti-punch-through (APT) implantation may be performed on an upper portion of the substrate 50 to form an APT region. During the APT implantation, impurities may be implanted in the substrate 50. The impurities may have a conductivity type opposite from a conductivity type of source/drain regions that will be subsequently formed in each of the n-type region 50N and the p-type region 50P. The APT region may extend under the source/drain regions in the nano-FETs. The APT region may be used to reduce the leakage from the source/drain regions to the substrate 50. In some embodiments, the doping concentration in the APT region may be in the range of about $10^{18}$ $cm^{-3}$ to about $10^{19}$ $cm^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three layers of each of the first semiconductor layers 54 and the second semiconductor layers 56. It should be appreciated that the multi-layer stack 52 may include any number of the first semiconductor layers 54 and the second semiconductor layers 56.

In the illustrated embodiment, and as will be subsequently described in greater detail, the first semiconductor layers 54 will be removed and the second semiconductor layers 56 will patterned to form channel regions for the nano-FETs in both the n-type region 50N and the p-type region 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nano-FETs in one region (e.g., the p-type region 50P), and the second semiconductor layers 56 will be patterned to form channel regions for nano-FETs in another region (e.g., the n-type region 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56 in the n-type region 50N, and the second semiconductor layers 56 may be removed without removing the first semiconductor layers 54 in the p-type region 50P.

Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. Each of the layers may have a small thickness, such as a thickness in a range of about 5 nm to about 30 nm. In some embodiments, some layers (e.g., the second semiconductor layers 56) are formed to be thinner than other layers (e.g., the first semiconductor layers 54). For example, in embodiments in which the first semiconductor layers 54 are sacrificial layers (or dummy layers) and the second semiconductor layers 56 are patterned to form channel regions for the nano-FETs in both the n-type region 50N and the p-type region 50P, the first semiconductor layers 54 can have a first thickness $T_1$ and the second semiconductor layers 56 can have a second thickness $T_2$, with the second thickness $T_2$ being from about 30% to about 60% less than the first thickness $T_1$. Forming the second semiconductor layers 56 to a smaller thickness allows the channel regions to be formed at a greater density.

Figure 3:
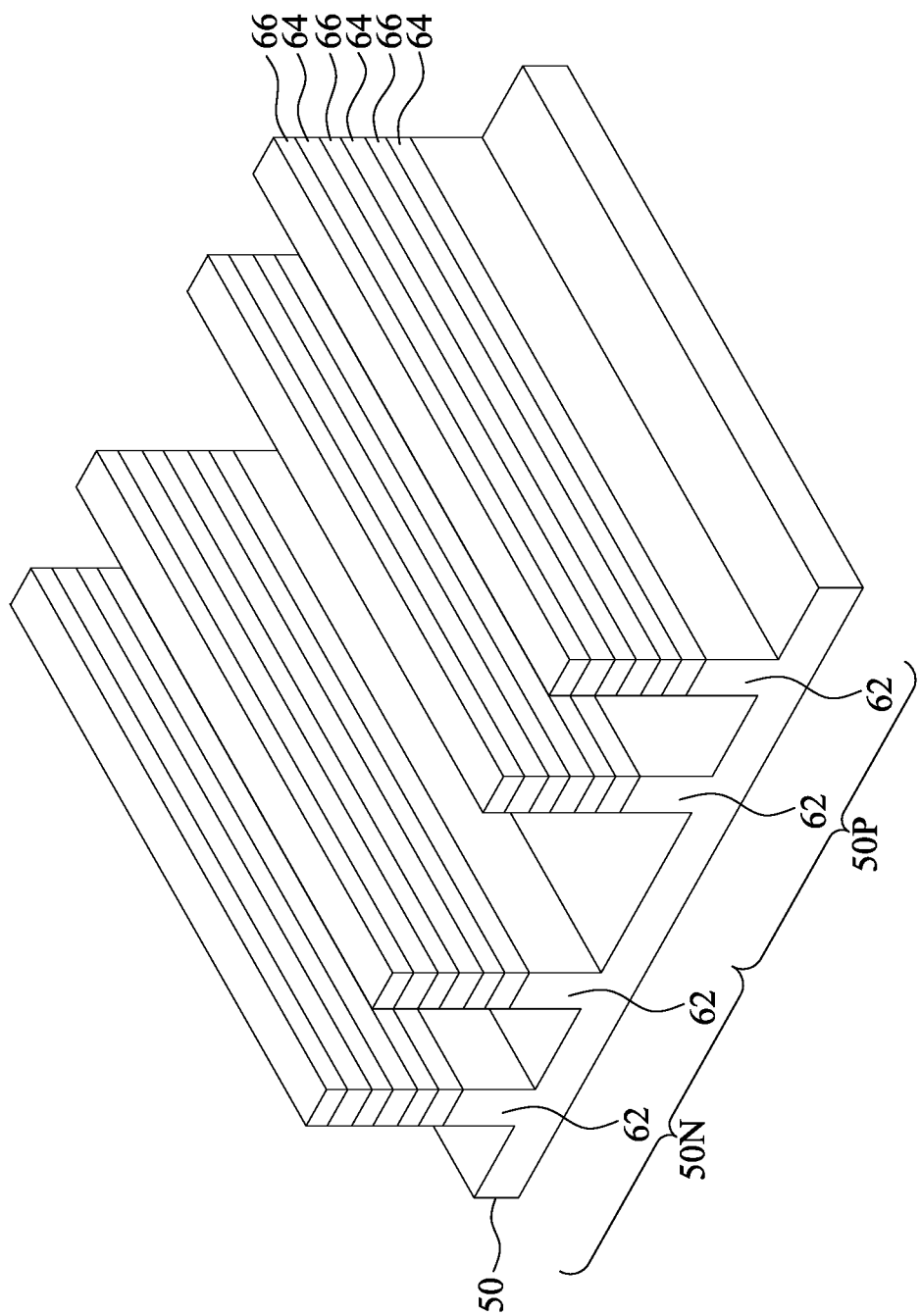

In FIG. 3, trenches are patterned in the substrate 50 and the multi-layer stack 52 to form fins 62, first nanostructures 64, and second nanostructures 66. The fins 62 are semiconductor strips patterned in the substrate 50. The first nanostructures 64 and the second nanostructures 66 include the remaining portions of the first semiconductor layers 54 and the second semiconductor layers 56, respectively. The trenches may be patterned by any acceptable etch process, such as a reactive ion etch (RIE), neutral beam etch (NBE), the like, or a combination thereof. The etching may be anisotropic.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 62 and the nanostructures 64, 66. In some embodiments, the mask (or other layer) may remain on the nanostructures 64, 66.

The fins 62 and the nanostructures 64, 66 may each have widths in a range of about 8 nm to about 40 nm. In the illustrated embodiment, the fins 62 and the nanostructures 64, 66 have substantially equal widths in the n-type region 50N and the p-type region 50P. In another embodiment, the fins 62 and the nanostructures 64, 66 in one region (e.g., the n-type region 50N) are wider or narrower than the fins 62 and the nanostructures 64, 66 in another region (e.g., the p-type region 50P).

Figure 4:
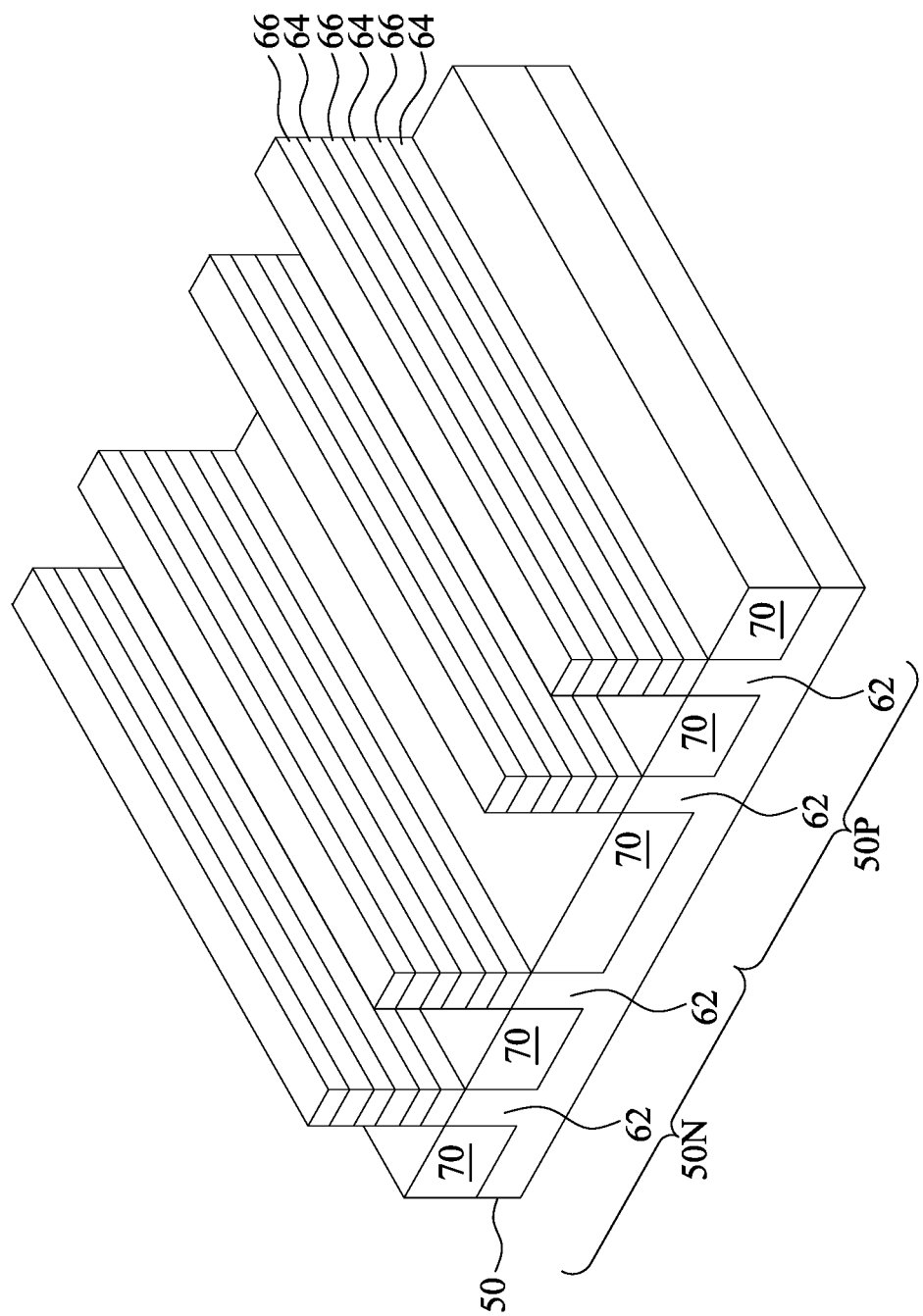

In FIG. 4, STI regions 70 are formed over the substrate 50 and between adjacent fins 62. The STI regions 70 are disposed around at least a portion of the fins 62 such that at least a portion of the nanostructures 64, 66 protrude from between adjacent STI regions 70. In the illustrated embodiment, the top surfaces of the STI regions 70 are coplanar (within process variations) with the top surfaces of the fins 62. In some embodiments, the top surfaces of the STI regions 70 are above or below the top surfaces of the fins 62. The STI regions 70 separate the features of adjacent devices.

The STI regions 70 may be formed by any suitable method. For example, an insulation material can be formed over the substrate 50 and the nanostructures 64, 66, and between adjacent fins 62. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable CVD (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the STI regions 70 are each illustrated as a single layer, some embodiments may utilize multiple layers. For example, in some embodiments a liner (not separately illustrated) may first be formed along surfaces of the substrate 50, the fins 62, and the nanostructures 64, 66. Thereafter, a fill material, such as those previously described may be formed over the liner.

A removal process is then applied to the insulation material to remove excess insulation material over the nanostructures 64, 66. In some embodiments, a planarization process such as a chemical mechanical polish (CMP), an etch-back process, combinations thereof, or the like may be utilized. In embodiments in which a mask remains on the nanostructures 64, 66, the planarization process may expose the mask or remove the mask. After the planarization process, the top surfaces of the insulation material and the mask (if present) or the nanostructures 64, 66 are coplanar (within process variations). Accordingly, the top surfaces of the mask (if present) or the nanostructures 64, 66 are exposed through the insulation material. In the illustrated embodiment, no mask remains on the nanostructures 64, 66. The insulation material is then recessed to form the STI regions 70. The insulation material is recessed such that at least a portion of the nanostructures 64, 66 protrude from between adjacent portions of the insulation material. Further, the top surfaces of the STI regions 70 may have a flat surface as illustrated, a convex surface, a concave surface (such as dishing), or a combination thereof. The top surfaces of the STI regions 70 may be formed flat, convex, and/or concave by an appropriate etch. The insulation material may be recessed using any acceptable etching process, such as one that is selective to the material of the insulation material (e.g., selectively etches the insulation material of the STI regions 70 at a faster rate than the materials of the fins 62 and the nanostructures 64, 66). For example, an oxide removal may be performed using dilute hydrofluoric (dHF) acid.

The process previously described is just one example of how the fins 62 and the nanostructures 64, 66 may be formed. In some embodiments, the fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the substrate 50, the fins 62, and/or the nanostructures 64, 66. The wells may have a conductivity type opposite from a conductivity type of source/drain regions that will be subsequently formed in each of the n-type region 50N and the p-type region 50P. In some embodiments, a p-type well is formed in the n-type region 50N, and a n-type well is formed in the p-type region 50P. In some embodiments, a p-type well or a n-type well is formed in both the n-type region 50N and the p-type region 50P.

In embodiments with different well types, different implant steps for the n-type region 50N and the p-type region 50P may be achieved using a mask (not separately illustrated) such as a photoresist. For example, a photoresist may be formed over the fins 62, the nanostructures 64, 66, and the STI regions 70 in the n-type region 50N. The photoresist is patterned to expose the p-type region 50P. The photoresist can be formed by using a spin-on technique and can be patterned using acceptable photolithography techniques. Once the photoresist is patterned, a n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of about $10^{13}$ cm$^{-3}$ to about $10^{14}$ cm$^{-3}$. After the implant, the photoresist is removed, such as by any acceptable ashing process.

Following or prior to the implanting of the p-type region 50P, a mask (not separately illustrated) such as a photoresist is formed over the fins 62, the nanostructures 64, 66, and the STI regions 70 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of about $10^{13}$ cm$^{-3}$ to about $10^{14}$ cm$^{-3}$. After the implant, the photoresist is removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the fins 62 and/or the nanostructures 64, 66, the grown materials may be in situ doped during growth, which may obviate the implantations, although in situ and implantation doping may be used together.

Figure 5:
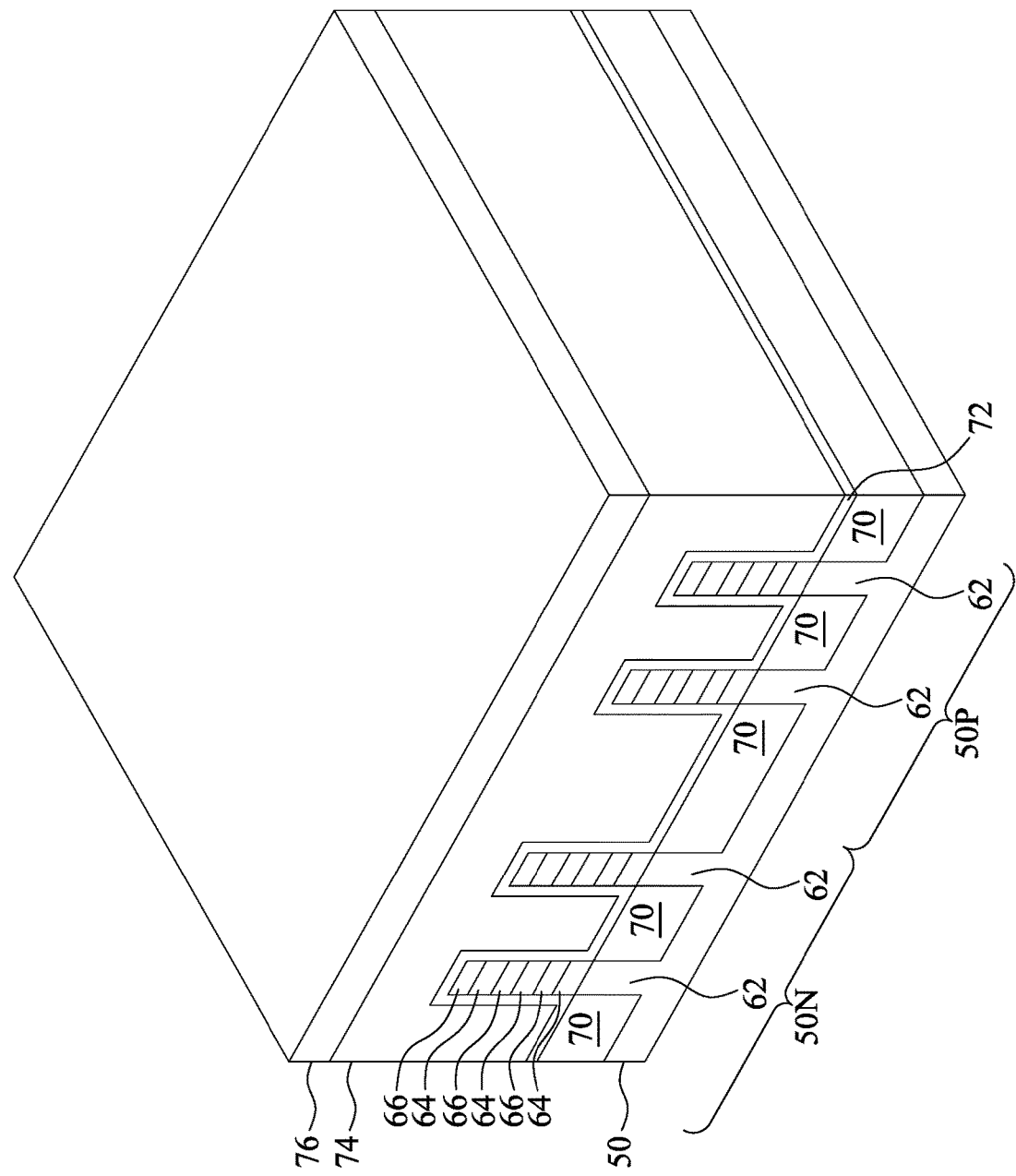

In FIG. 5, a dummy dielectric layer 72 is formed on the fins 62 and the nanostructures 64, 66. The dummy dielectric layer 72 may be formed of a dielectric material such as silicon oxide, silicon nitride, a combination thereof, or the like, which may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The mask layer 76 may be deposited over the dummy gate layer 74. The dummy gate layer 74 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 74 may be formed of material(s) that have a high etching selectivity from the etching of insulation materials, e.g., the STI regions 70 and/or the dummy dielectric layer 72. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the fins 62, the nanostructures 64, 66, and the STI regions 70, such that the dummy dielectric layer 72 extends over the STI regions 70 and between the dummy gate layer 74 and the STI regions 70. In another embodiment, the dummy dielectric layer 72 covers only the fins 62 and the nanostructures 64, 66.

Figure 6:
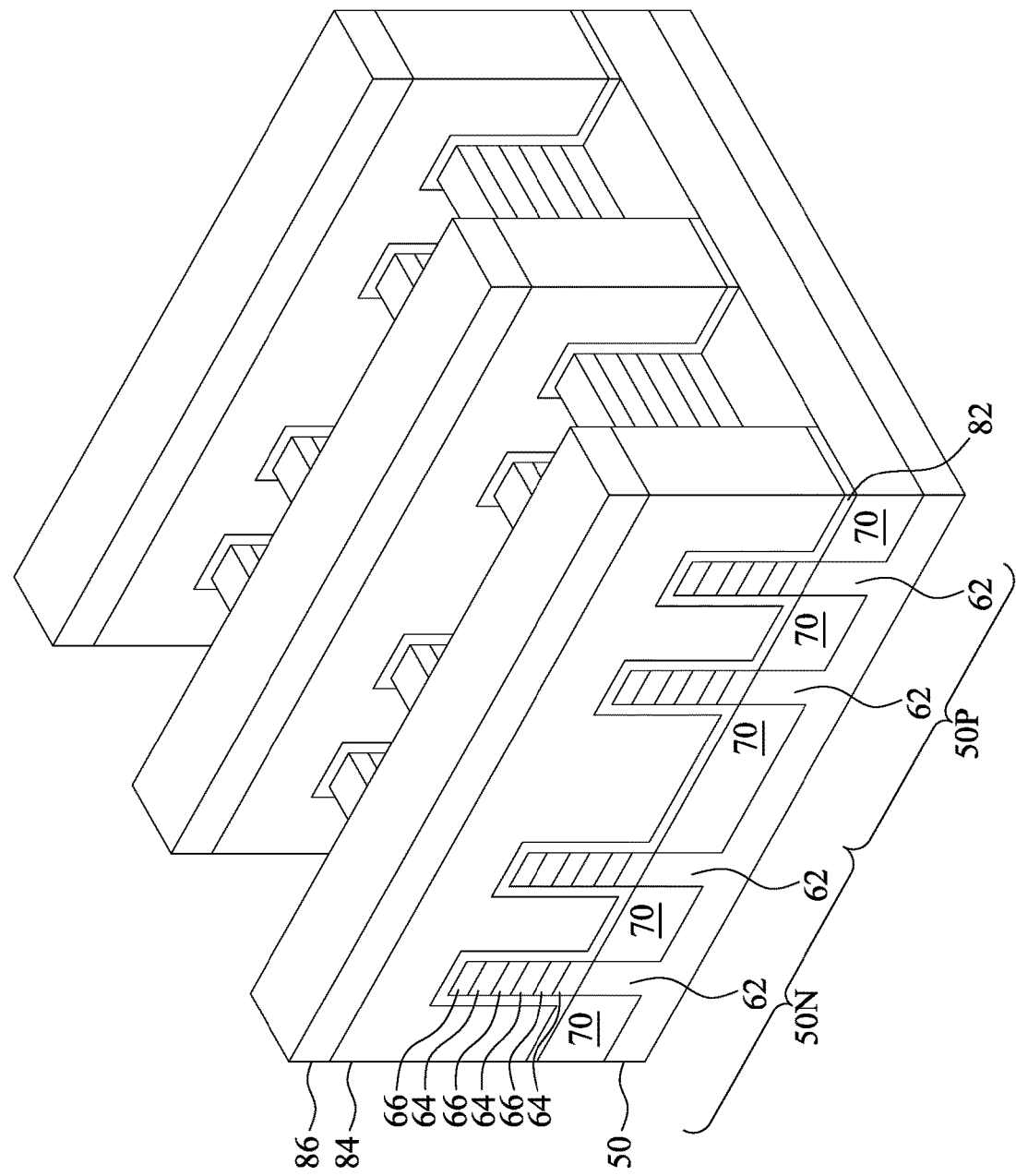

In FIG. 6, the mask layer 76 is patterned using acceptable photolithography and etching techniques to form masks 86. The pattern of the masks 86 is then transferred to the dummy gate layer 74 by any acceptable etching technique to form dummy gates 84. The pattern of the masks 86 may optionally be further transferred to the dummy dielectric layer 72 by any acceptable etching technique to form dummy dielectrics 82. The dummy gates 84 cover portions of the nanostructures 64, 66 that will be exposed in subsequent processing to form channel regions. Specifically, the dummy gates 84 extend along the portions of the nanostructures 66 that will be patterned to form channel regions 68. The pattern of the masks 86 may be used to physically separate adjacent dummy gates 84. The dummy gates 84 may also have lengthwise directions substantially perpendicular (within process variations) to the lengthwise directions of the fins 62. The masks 86 can optionally be removed after patterning, such as by any acceptable etching technique.

FIGS. 7A-19B illustrate various additional steps in the manufacturing of embodiment devices. FIGS. 7A-19B illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure.

Figure 7B:
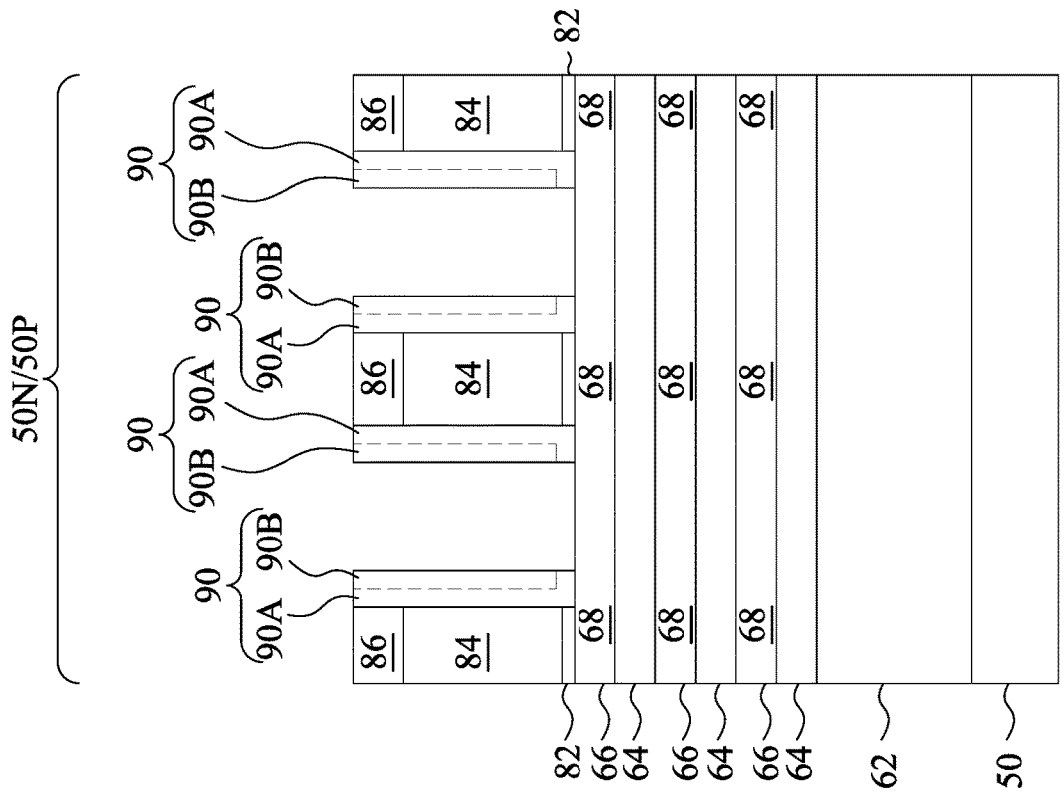
Figure 7A:
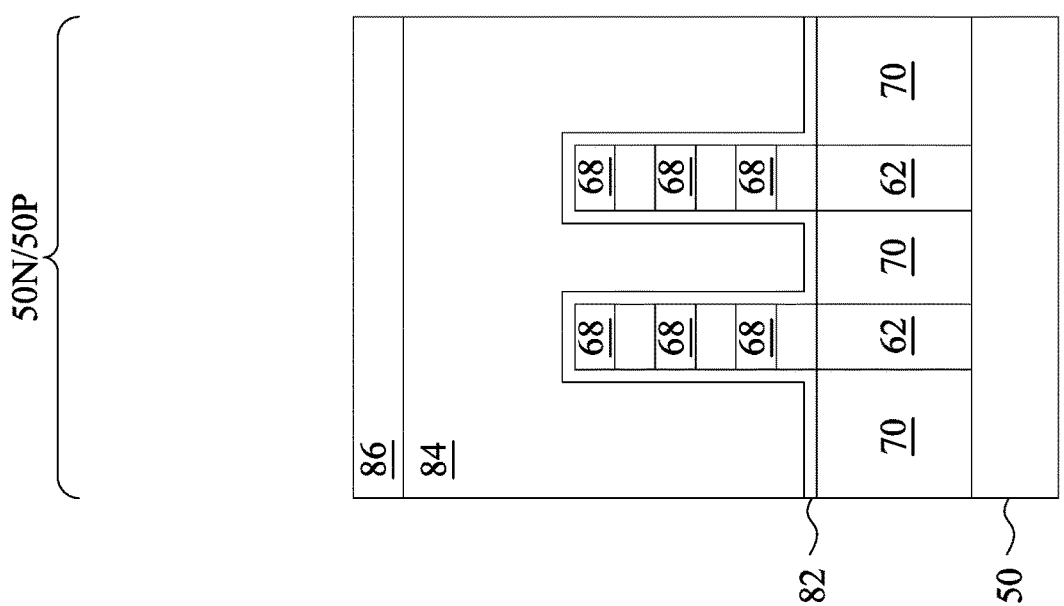

In FIGS. 7A and 7B, gate spacers 90 are formed over the nanostructures 64, 66, on exposed sidewalls of the masks 86 (if present), the dummy gates 84, and the dummy dielectrics 82. The gate spacers 90 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. In the illustrated embodiment, the gate spacers 90 each include multiple layers, e.g., a first spacer layer 90A and a second spacer layer 90B. In some embodiments, the first spacer layers 90A and the second spacer layers 90B are formed of silicon oxycarbonitride (e.g., $SiO_xN_yC_{1-x-y}$, where x and y are in the range of 0 to 1), with the first spacer layers 90A formed of a similar or a different composition of silicon oxycarbonitride than the second spacer layers 90B. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 90). As will be subsequently described in greater detail, the dielectric material(s), when etched, may also have portions left on the sidewalls of the fins 62 and/or the nanostructures 64, 66 (thus forming fin spacers 92, see FIGS. 9C and 9D). After etching, the fin spacers 92 and/or the gate spacers 90 can have straight sidewalls (as illustrated) or can have curved sidewalls (not separately illustrated).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 62 and/or the nanostructures 64, 66 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the fins 62 and/or the nanostructures 64, 66 exposed in the n-type region 50N. The mask may then be removed. The n-type impurities may be any of the n-type impurities previously described, and the p-type impurities may be any of the p-type impurities previously described. During the implanting, the channel regions 68 remain covered by the dummy gates 84, so that the channel regions 68 remain substantially free of the impurity implanted to form the LDD regions. The LDD regions may have a concentration of impurities in the range of about $10^{15}$ $cm^{-3}$ to about $10^{19}$ $cm^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 8B:
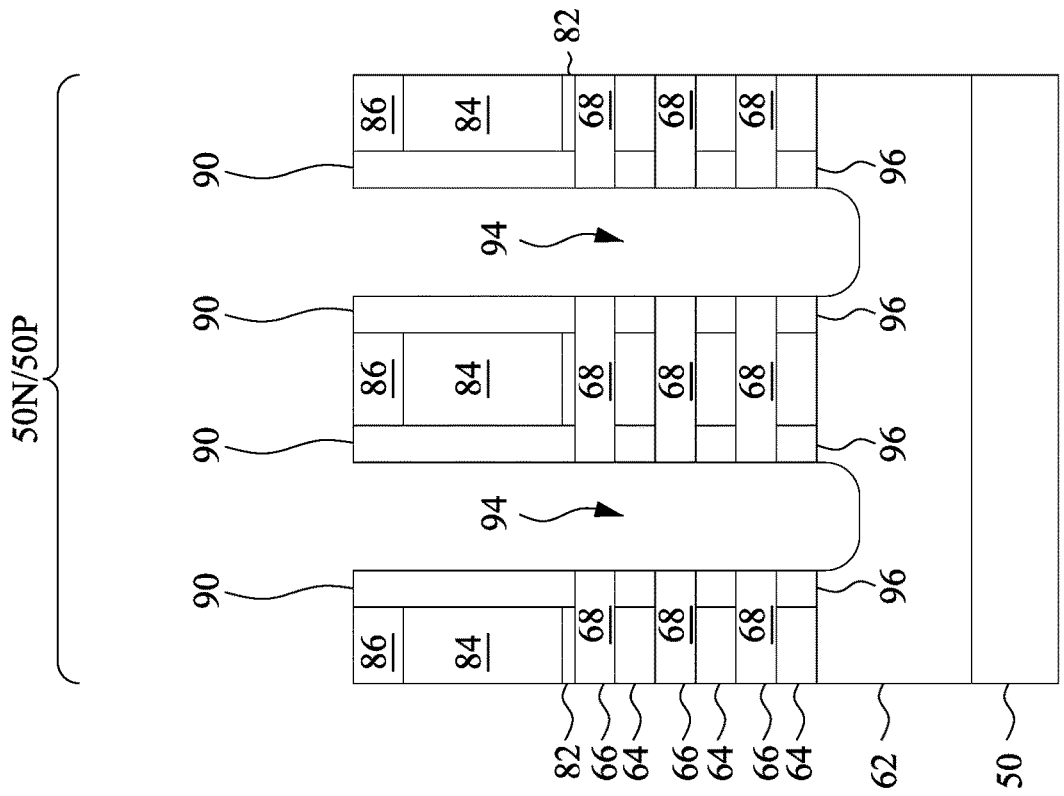
Figure 8A:
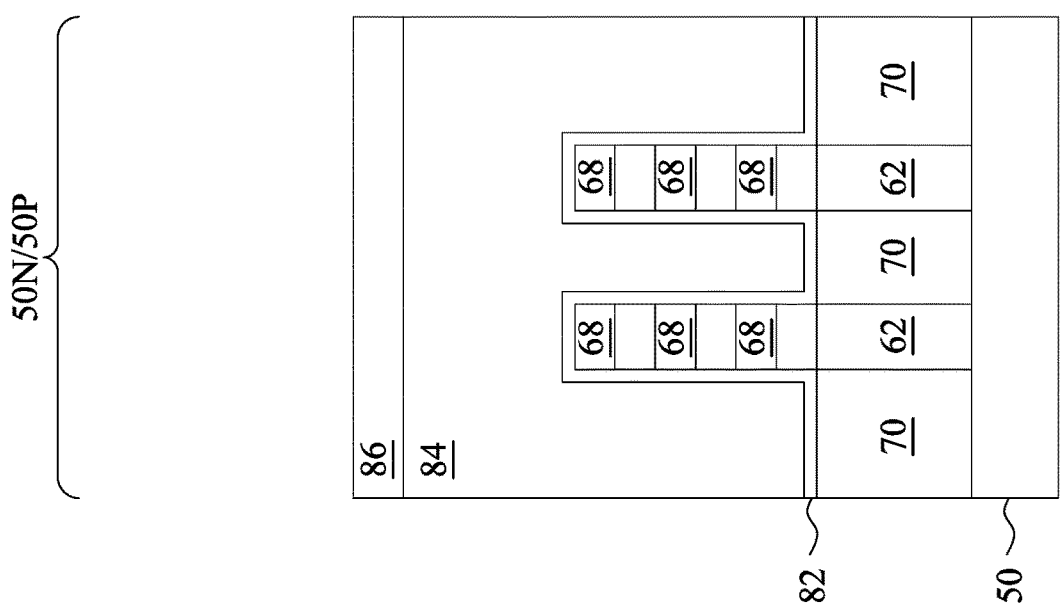

In FIGS. 8A and 8B, source/drain recesses 94 are formed in the nanostructures 64, 66. In the illustrated embodiment, the source/drain recesses 94 extend through the nanostructures 64, 66 and into the fins 62. The source/drain recesses 94 may also extend into the substrate 50. In various embodiments, the source/drain recesses 94 may extend to a top surface of the substrate 50 without etching the substrate 50; the fins 62 may be etched such that bottom surfaces of the source/drain recesses 94 are disposed below the top surfaces of the STI regions 70; or the like. The source/drain recesses 94 may be formed by etching the nanostructures 64, 66 using an anisotropic etching processes, such as a RIE, a NBE, or the like. The gate spacers 90 and the dummy gates 84 collectively mask portions of the fins 62 and/or the nanostructures 64, 66 during the etching processes used to form the source/drain recesses 94. A single etch process may be used to etch each of the nanostructures 64, 66, or multiple etch processes may be used to etch the nanostructures 64, 66. Timed etch processes may be used to stop the etching of the source/drain recesses 94 after the source/drain recesses 94 reach a desired depth.

Optionally, inner spacers 96 are formed on the sidewalls of the remaining portions of the first nanostructures 64, e.g., those sidewalls exposed by the source/drain recesses 94. As will be subsequently described in greater detail, source/drain regions will be subsequently formed in the source/drain recesses 94, and the first nanostructures 64 will be subsequently replaced with corresponding gate structures. The inner spacers 96 act as isolation features between the subsequently formed source/drain regions and the subsequently formed gate structures. Further, the inner spacers 96 may be used to substantially prevent damage to the subsequently formed source/drain regions by subsequent etching processes, such as etching processes used to subsequently remove the first nanostructures 64.

As an example to form the inner spacers 96, the source/drain recesses 94 can be laterally expanded. Specifically, portions of the sidewalls of the first nanostructures 64 exposed by the source/drain recesses 94 may be recessed. Although sidewalls of the first nanostructures 64 are illustrated as being straight, the sidewalls may be concave or convex. The sidewalls may be recessed by any acceptable etching process, such as one that is selective to the material of the first nanostructures 64 (e.g., selectively etches the material of the first nanostructures 64 at a faster rate than the material of the second nanostructures 66). The etching may be isotropic. For example, when the second nanostructures 66 are formed of silicon and the first nanostructures 64 are formed of silicon germanium, the etching process may be a wet etch using tetramethylammonium hydroxide (TMAH), ammonium hydroxide ($NH_4OH$), or the like. In another embodiment, the etching process may be a dry etch using a fluorine-based gas such as hydrogen fluoride (HF) gas. In some embodiments, the same etching process may be continually performed to both form the source/drain recesses 94 and recess the sidewalls of the first nanostructures 64. The inner spacers 96 can then be formed by conformally forming an insulating material and subsequently etching the insulating material. The insulating material may be silicon nitride or silicon oxynitride, although any suitable material, such as low-dielectric constant (low-k) materials having a k-value less than about 3.5, may be utilized. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 96 are illustrated as being flush with respect to the sidewalls of the gate spacers 90, the outer sidewalls of the inner spacers 96 may extend beyond or be recessed from the sidewalls of the gate spacers 90. In other words, the inner spacers 96 may partially fill, completely fill, or overfill the sidewall recesses. Moreover, although the sidewalls of the inner spacers 96 are illustrated as being straight, the sidewalls of the inner spacers 96 may be concave or convex.

Figure 9B:
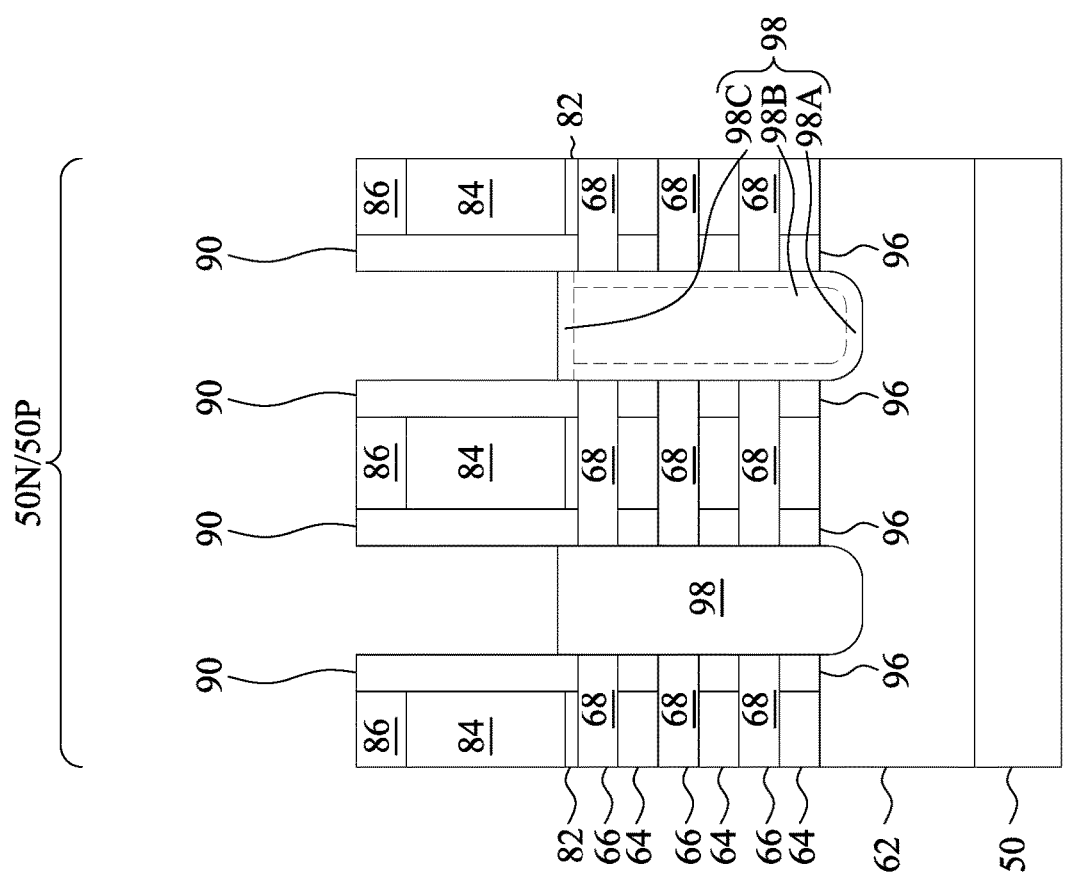
Figure 9A:
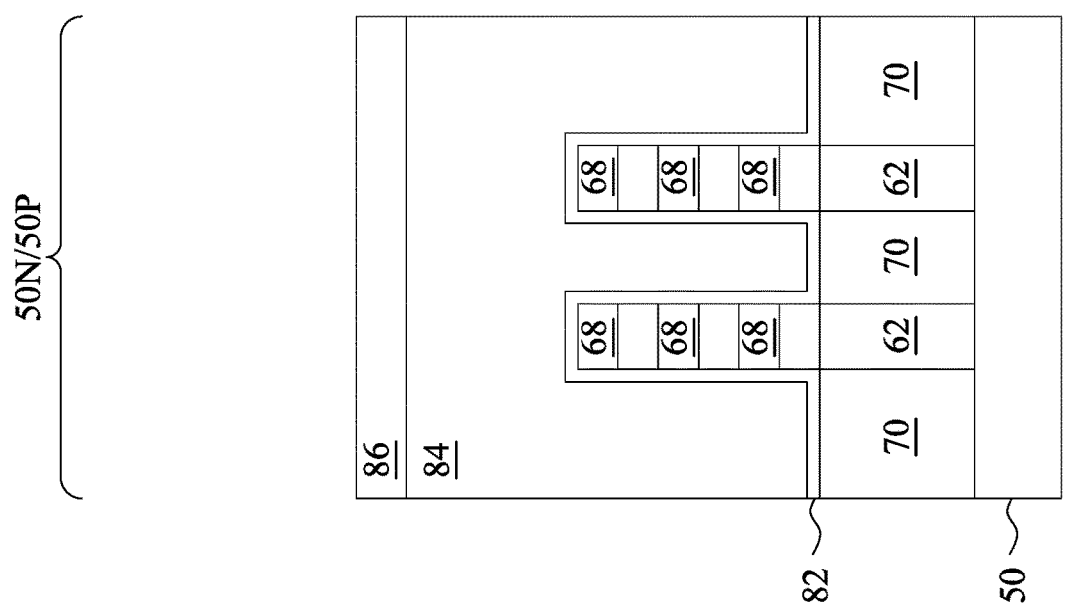
Figure 9D:
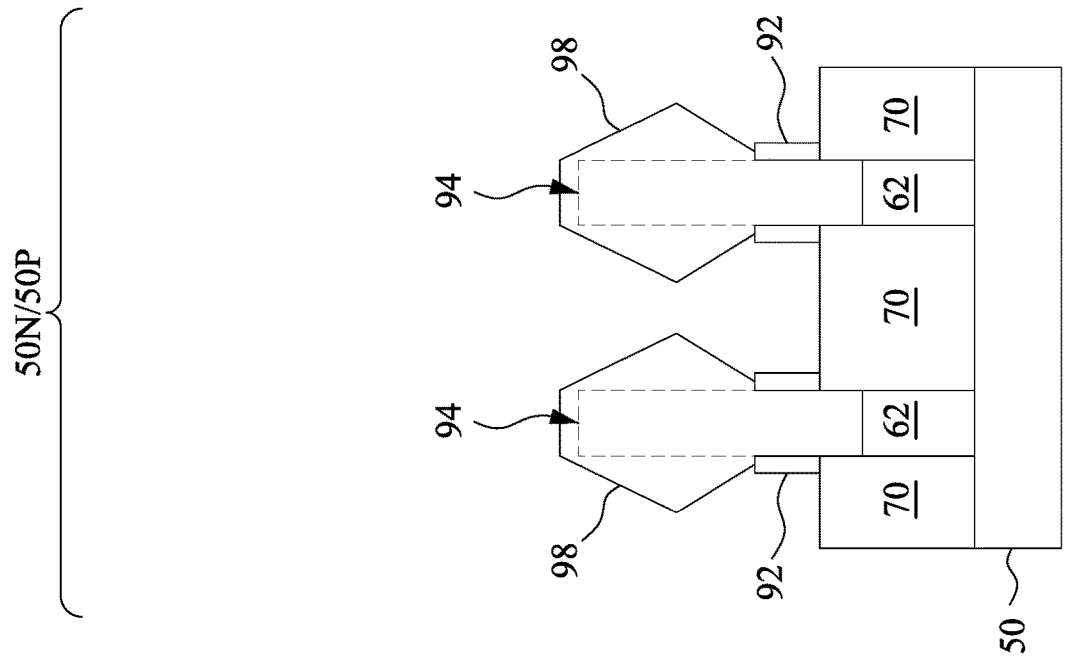
Figure 9C:
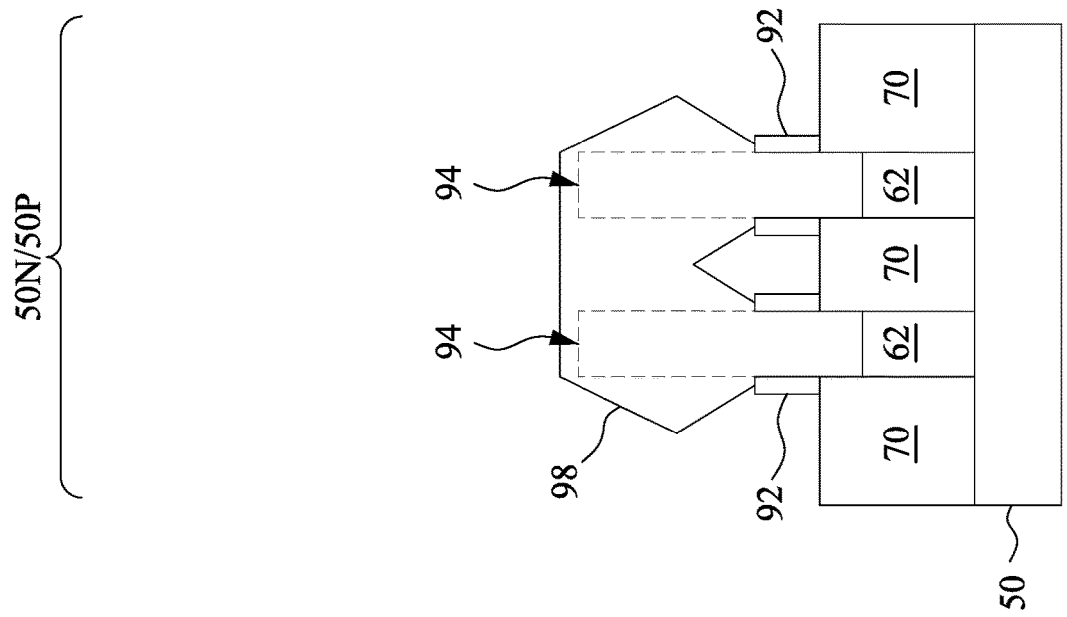

In FIGS. 9A and 9B, epitaxial source/drain regions 98 are formed in the source/drain recesses 94. The epitaxial source/drain regions 98 are formed in the source/drain recesses 94 such that each dummy gate 84 (and corresponding channel regions 68) is disposed between respective adjacent pairs of the epitaxial source/drain regions 98. In some embodiments, the gate spacers 90 and the inner spacers 96 are used to separate the epitaxial source/drain regions 98 from, respectively, the dummy gates 84 and the first nanostructures 64 by an appropriate lateral distance so that the epitaxial source/drain regions 98 do not short out with subsequently formed gates of the resulting nano-FETs. A material of the epitaxial source/drain regions 98 may be selected to exert stress in the respective channel regions 68, thereby improving performance.

The epitaxial source/drain regions 98 in the n-type region 50N may be formed by masking the p-type region 50P. Then, the epitaxial source/drain regions 98 in the n-type region 50N are epitaxially grown in the source/drain recesses 94 in the n-type region 50N. The epitaxial source/drain regions 98 may include any acceptable material appropriate for n-type devices. For example, the epitaxial source/drain regions 98 in the n-type region 50N may include materials exerting a tensile strain on the channel regions 68, such as silicon, silicon carbide, phosphorous doped silicon carbide, silicon phosphide, or the like. The epitaxial source/drain regions 98 in the n-type region 50N may be referred to as "n-type source/drain regions." The epitaxial source/drain regions 98 in the n-type region 50N may have surfaces raised from respective surfaces of the fins 62 and the nanostructures 64, 66, and may have facets.

The epitaxial source/drain regions 98 in the p-type region 50P may be formed by masking the n-type region 50N. Then, the epitaxial source/drain regions 98 in the p-type region 50P are epitaxially grown in the source/drain recesses 94 in the p-type region 50P. The epitaxial source/drain regions 98 may include any acceptable material appropriate for p-type devices. For example, the epitaxial source/drain regions 98 in the p-type region 50P may include materials exerting a compressive strain on the channel regions 68, such as silicon germanium, boron doped silicon germanium, germanium, germanium tin, or the like. The epitaxial source/drain regions 98 in the p-type region 50P may be referred to as "p-type source/drain regions." The epitaxial source/drain regions 98 in the p-type region 50P may have surfaces raised from respective surfaces of the fins 62 and the nanostructures 64, 66, and may have facets.

The epitaxial source/drain regions 98, the nanostructures 64, 66, and/or the fins 62 may be implanted with impurities to form source/drain regions, similar to the process previously described for forming LDD regions, followed by an anneal. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously described. In some embodiments, the epitaxial source/drain regions 98 may be in situ doped during growth.

As a result of the epitaxy processes used to form the epitaxial source/drain regions 98, upper surfaces of the epitaxial source/drain regions have facets which expand laterally outward beyond sidewalls of the fins 62 and the nanostructures 64, 66. In some embodiments, these facets cause adjacent epitaxial source/drain regions 98 to merge as illustrated by FIG. 9C. In some embodiments, adjacent epitaxial source/drain regions 98 remain separated after the epitaxy process is completed as illustrated by FIG. 9D. In the illustrated embodiments, the spacer etch used to form the gate spacers 90 is adjusted to also form fin spacers 92 on sidewalls of the fins 62 and/or the nanostructures 64, 66. The fin spacers 92 are formed to cover a portion of the sidewalls of the fins 62 and/or the nanostructures 64, 66 that extend above the STI regions 70, thereby blocking the epitaxial growth. In another embodiment, the spacer etch used to form the gate spacers 90 is adjusted to not form fin spacers, so as to allow the epitaxial source/drain regions 98 to extend to the surface of the STI regions 70.

The epitaxial source/drain regions 98 may include one or more semiconductor material layers. For example, the epitaxial source/drain regions 98 may each include a liner layer 98A, a main layer 98B, and a finishing layer 98C (or more generally, a first semiconductor material layer, a second semiconductor material layer, and a third semiconductor material layer). Any number of semiconductor material layers may be used for the epitaxial source/drain regions 98. Each of the liner layer 98A, the main layer 98B, and the finishing layer 98C may be formed of different semiconductor materials and may be doped to different impurity concentrations. In some embodiments, the liner layer 98A may have a lesser concentration of impurities than the main layer 98B, and the finishing layer 98C may have a greater concentration of impurities than the liner layer 98A and a lesser concentration of impurities than the main layer 98B. In embodiments in which the epitaxial source/drain regions 98 include three semiconductor material layers, the liner layers 98A may be grown in the source/drain recesses 94, the main layers 98B may be grown on the liner layers 98A, and the finishing layers 98C may be grown on the main layers 98B.

Figure 10B:
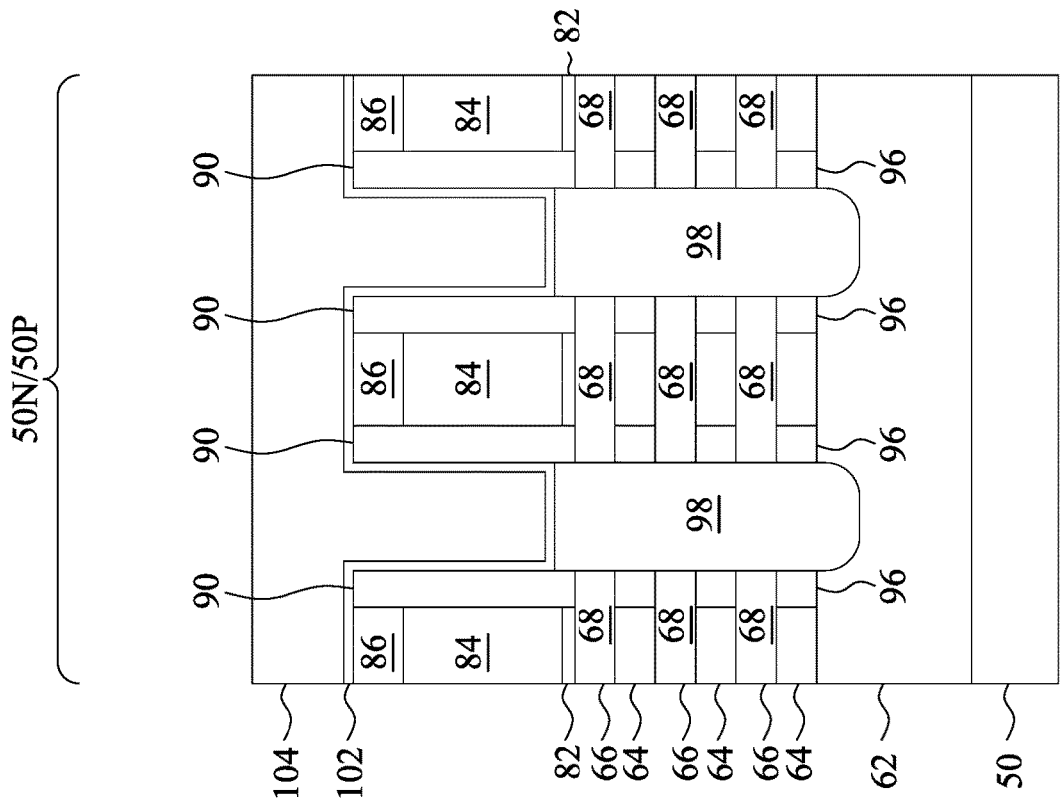
Figure 10A:
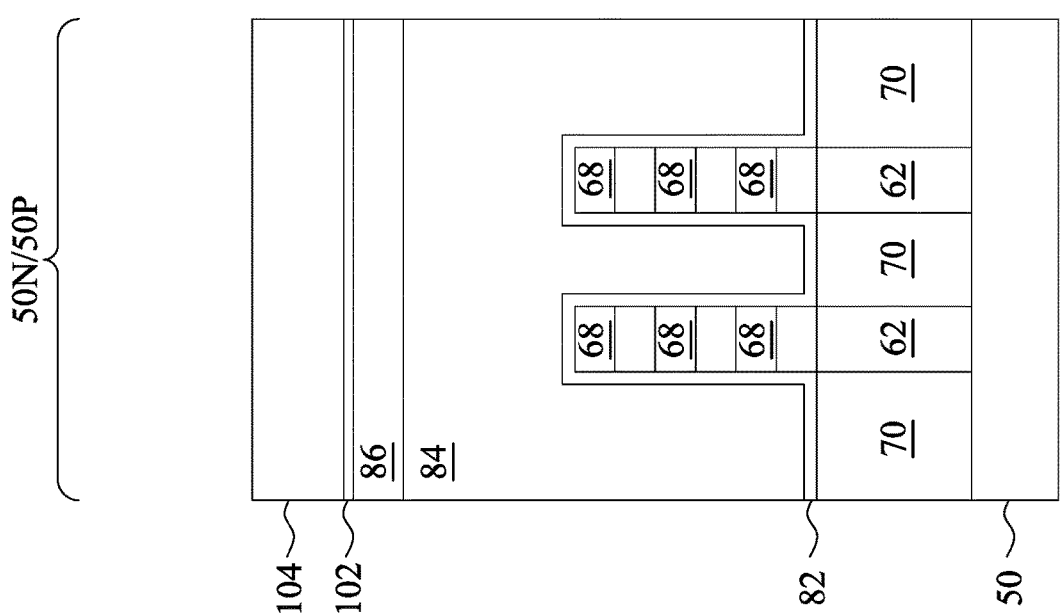

In FIGS. 10A and 10B, a first inter-layer dielectric (ILD) 104 is deposited over the epitaxial source/drain regions 98, the gate spacers 90, the masks 86 (if present) or the dummy gates 84. The first ILD 104 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 102 is formed between the first ILD 104 and the epitaxial source/drain regions 98, the gate spacers 90, and the masks 86 (if present) or the dummy gates 84. The CESL 102 may be formed of a dielectric material, such as silicon nitride, silicon oxide, silicon oxynitride, or the like, having a high etching selectivity from the etching of the first ILD 104. The CESL 102 may be formed by any suitable method, such as CVD, ALD, or the like.

In FIGS. 11A and 11B, a removal process is performed to level the top surfaces of the first ILD 104 with the top surfaces of the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 90 along sidewalls of the masks 86. After the planarization process, the top surfaces of the gate spacers 90, the first ILD 104, the CESL 102, and the masks 86 (if present) or the dummy gates 84 are coplanar (within process variations). Accordingly, the top surfaces of the masks 86 (if present) or the dummy gates 84 are exposed through the first ILD 104. In the illustrated embodiment, the masks 86 remain, and the planarization process levels the top surfaces of the first ILD 104 with the top surfaces of the masks 86.

Figure 12B:
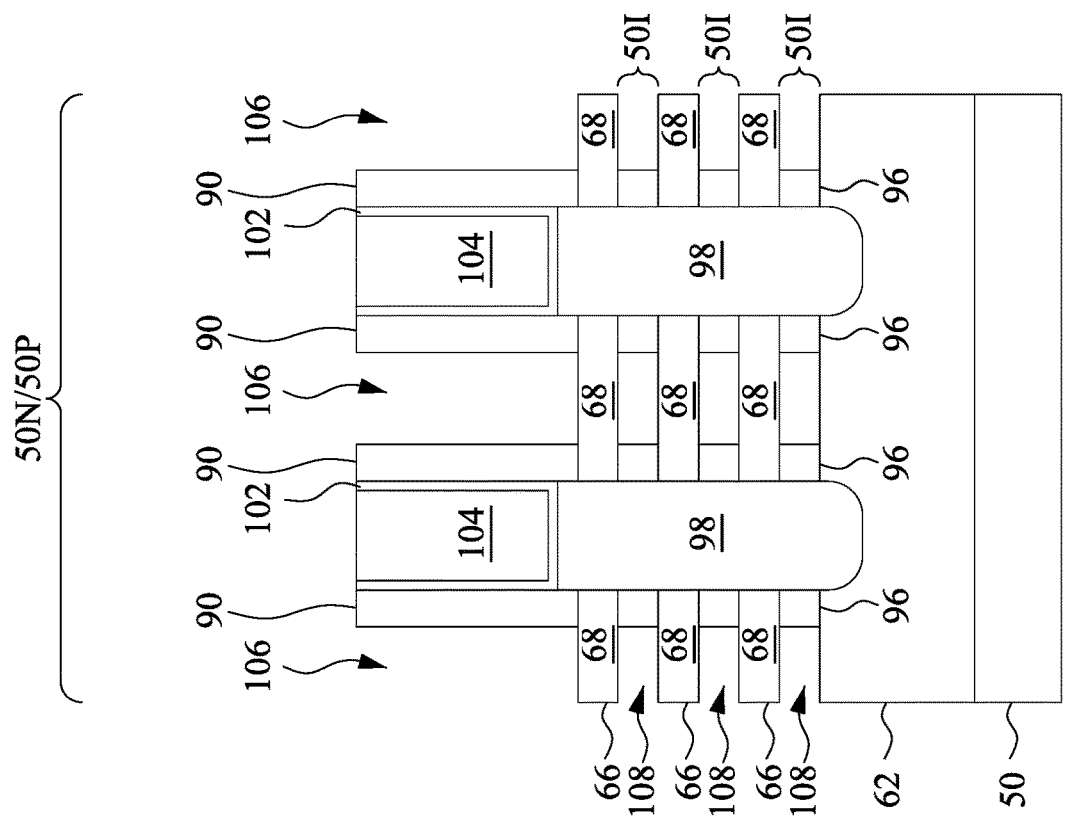
Figure 12A:
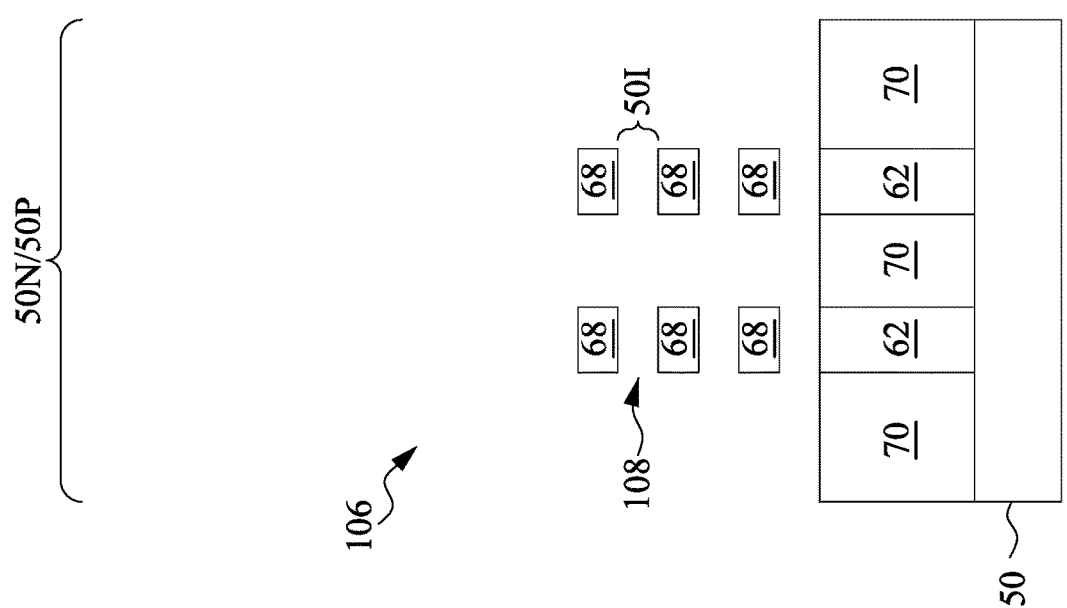

In FIGS. 12A and 12B, the masks 86 (if present) and the dummy gates 84 are removed in an etching process, so that recesses 106 are formed. Portions of the dummy dielectrics 82 in the recesses 106 are also removed. In some embodiments, the dummy gates 84 are removed by an anisotropic dry etch process. For example, the etching process may include a dry etch process using reaction gas(es) that selectively etch the dummy gates 84 at a faster rate than the first ILD 104 or the gate spacers 90. During the removal, the dummy dielectrics 82 may be used as etch stop layers when the dummy gates 84 are etched. The dummy dielectrics 82 are then removed. Each recess 106 exposes and/or overlies portions of the channel regions 68. Portions of the second nanostructures 66 which act as the channel regions 68 are disposed between adjacent pairs of the epitaxial source/drain regions 98.

The remaining portions of the first nanostructures 64 are then removed to expand the recesses 106, such that openings 108 are formed in regions 50I between the second nanostructures 66. The remaining portions of the first nanostructures 64 can be removed by any acceptable etching process that selectively etches the material of the first nanostructures 64 at a faster rate than the material of the second nanostructures 66. The etching may be isotropic. For example, when the first nanostructures 64 are formed of silicon germanium and the second nanostructures 66 are formed of silicon, the etching process may be a wet etch using tetramethylammonium hydroxide (TMAH), ammonium hydroxide (NH₄OH), or the like. In some embodiments, a trim process (not separately illustrated) is performed to decrease the thicknesses of the exposed portions of the second nanostructures 66. As illustrated more clearly in FIGS. 14A-16B (subsequently described in greater detail), the remaining portions of the second nanostructures 66 can have rounded corners.

Figures 13A, 13B:
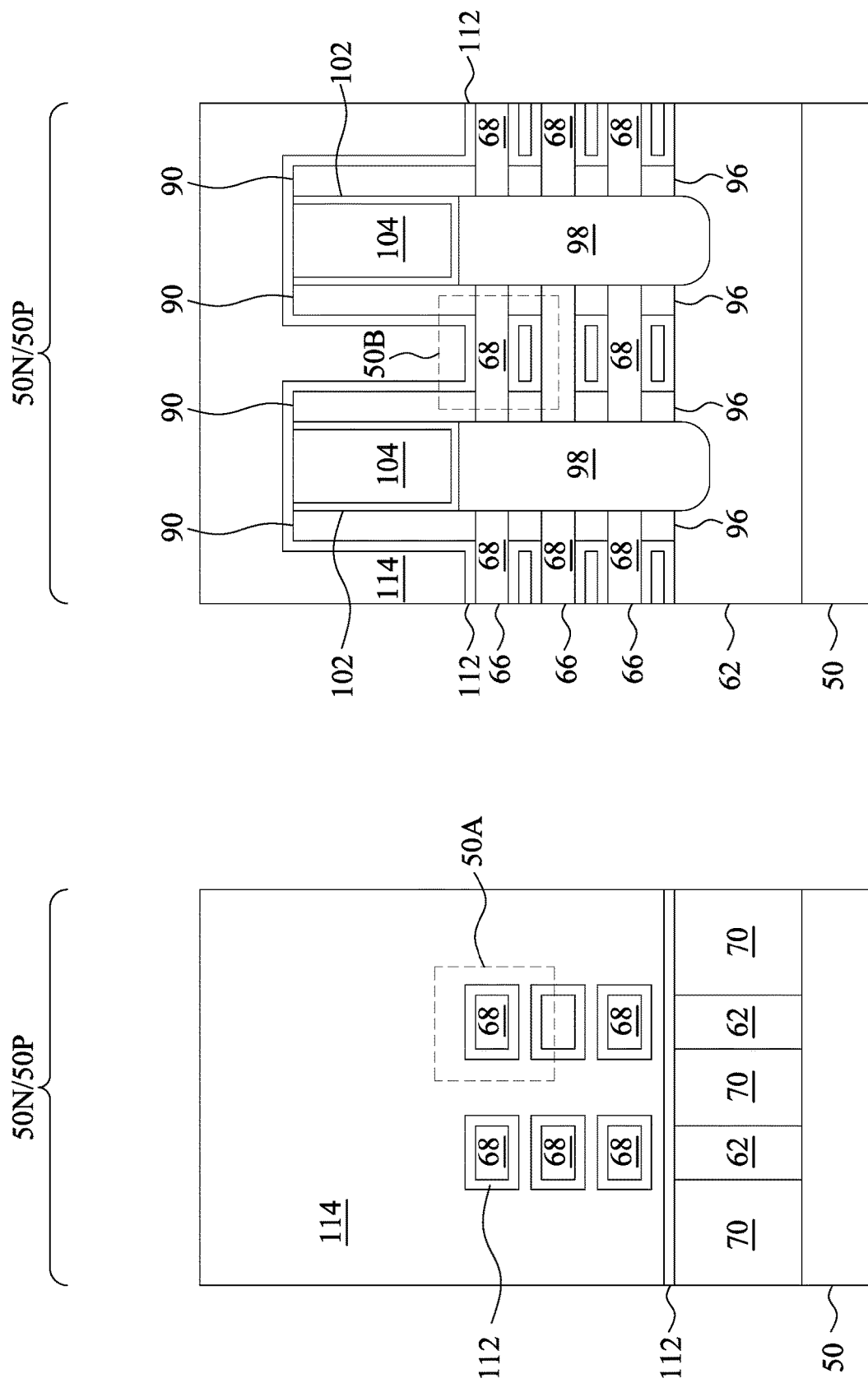

In FIGS. 13A and 13B, a gate dielectric layer 112 is formed in the recesses 106. A gate electrode layer 114 is formed on the gate dielectric layer 112. The gate dielectric layer 112 and the gate electrode layer 114 are layers for replacement gates, and each wrap around all (e.g., four) sides of the second nanostructures 66.

The gate dielectric layer 112 is disposed on the sidewalls and/or the top surfaces of the fins 62; on the top surfaces, the sidewalls, and the bottom surfaces of the second nanostructures 66; and on the sidewalls of the gate spacers 90. The gate dielectric layer 112 may also be formed on the top surfaces of the first ILD 104 and the gate spacers 90. The gate dielectric layer 112 may include an oxide such as silicon oxide or a metal oxide, a silicate such as a metal silicate, combinations thereof, multi-layers thereof, or the like. The gate dielectric layer 112 may include a dielectric material having a k-value greater than about 7.0, such as a metal oxide or a silicate of hafnium, aluminum, zirconium, lanthanum, manganese, barium, titanium, lead, and combinations thereof. Although a single-layered gate dielectric layer 112 is illustrated in FIGS. 13A and 13B, as will be subsequently described in greater detail, the gate dielectric layer 112 may include an interfacial layer and a main layer.

The gate electrode layer 114 may include a metal-containing material such as titanium nitride, titanium oxide, tantalum nitride, tantalum carbide, cobalt, ruthenium, aluminum, tungsten, combinations thereof, multi-layers thereof, or the like. Although a single-layered gate electrode layer 114 is illustrated in FIGS. 13A and 13B, as will be subsequently described in greater detail, the gate electrode layer 114 may include any number of work function tuning layers, any number of glue layers, and a fill material.

The formation of the gate dielectric layers 112 in the n-type region 50N and the p-type region 50P may occur simultaneously such that the gate dielectric layers 112 in each region are formed of the same materials, and the formation of the gate electrode layers 114 may occur simultaneously such that the gate electrode layers 114 in each region are formed of the same materials. In some embodiments, the gate dielectric layers 112 in each region may be formed by distinct processes, such that the gate dielectric layers 112 may be different materials and/or have a different number of layers, and/or the gate electrode layers 114 in each region may be formed by distinct processes, such that the gate electrode layers 114 may be different materials and/or have a different number of layers. Various masking steps may be used to mask and expose appropriate regions when using distinct processes. In the following description, at least portions of the gate electrode layers 114 in the n-type region 50N and the gate electrode layers 114 in the p-type region 50P are formed separately.

Figure 14B:
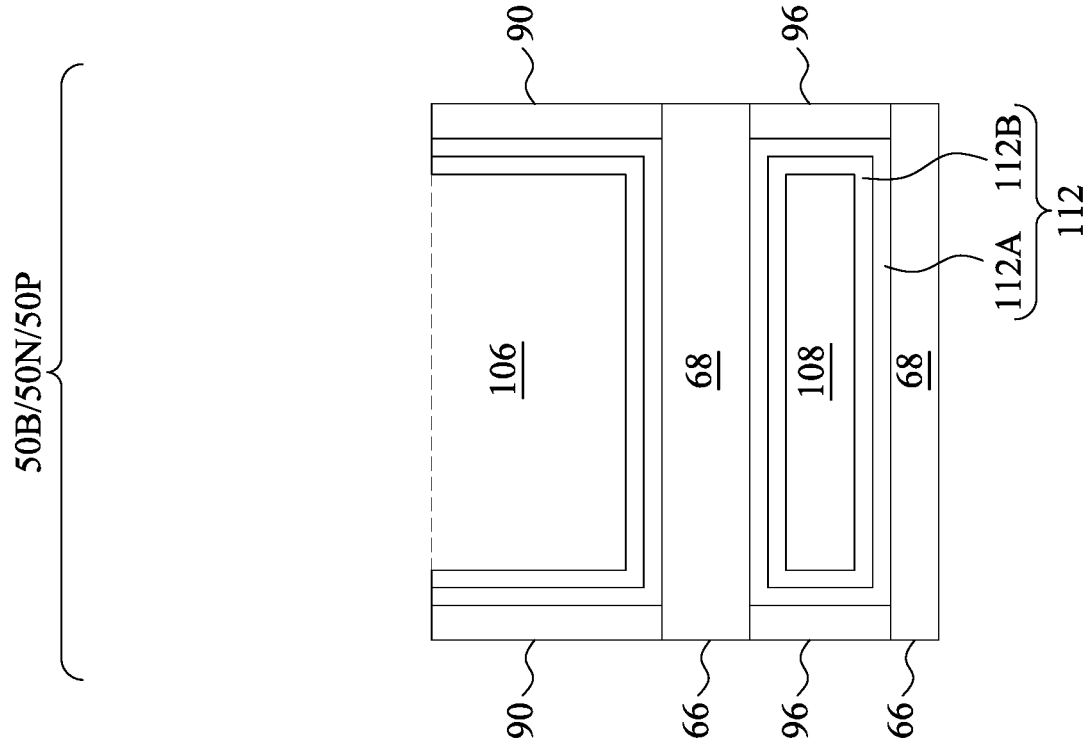
Figure 14A:
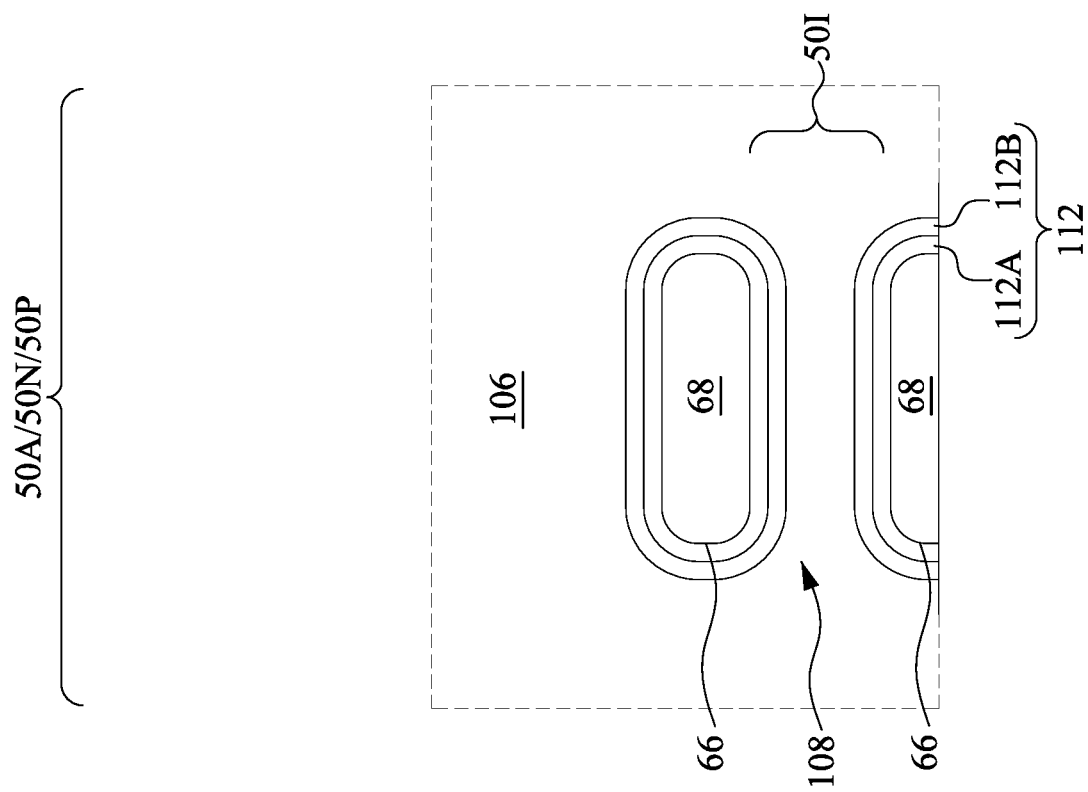
Figure 16A:
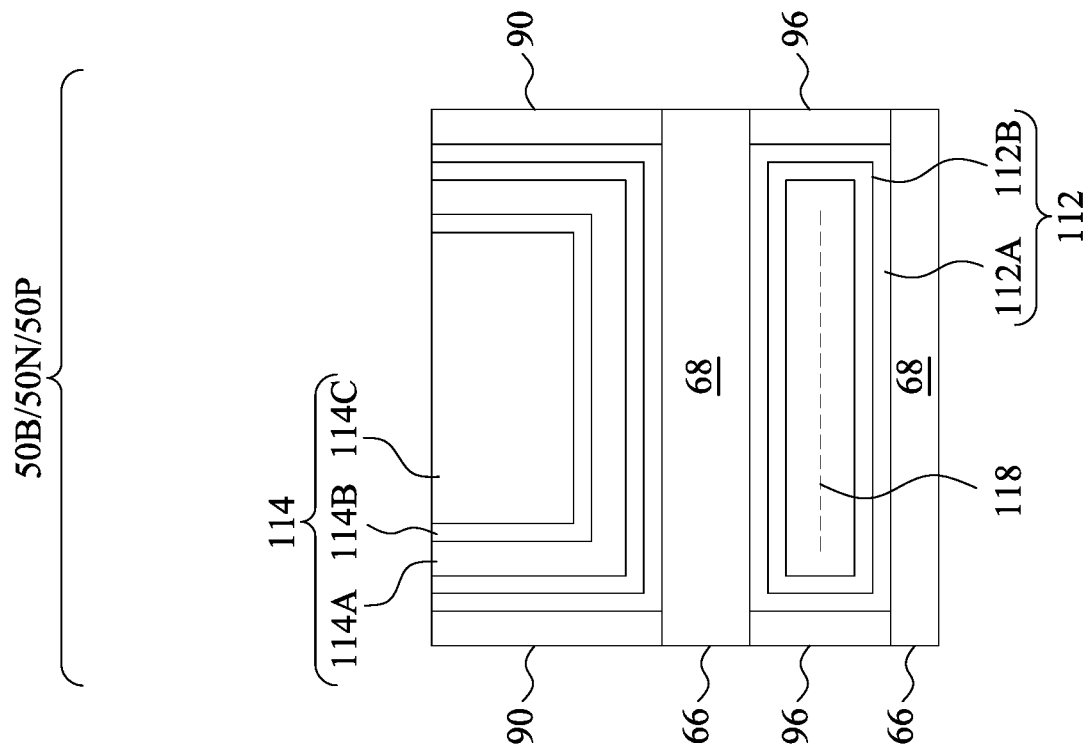
Figure 16B:
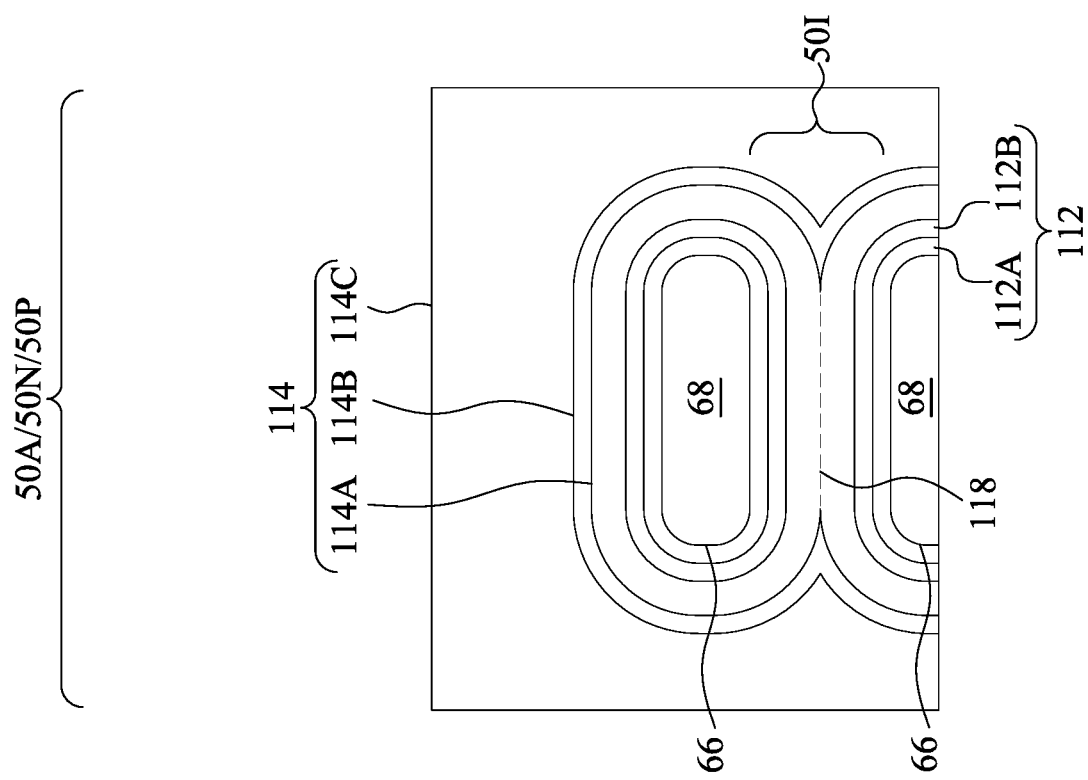

FIGS. 14A-16B illustrate a process in which gate dielectric layers 112 and gate electrode layers 114 for replacement gates are formed in the recesses 106. FIGS. 14A, 15A, and 16A illustrate features in a region 50A in FIG. 13A. FIGS. 14B, 15B, and 16B illustrate features in a region 50B in FIG. 13B. The replacement gate layers include work function tuning layer(s) that are each formed of a pure work function metal. A pure work function metal is a work function tuning material formed of a pure metal. Specifically, a pure work function metal has a composition that includes one or more metal elements and is substantially free of metalloid elements and nonmetal elements. A pure work function metal can have a composition of greater than 95 atomic percent (at. %) metals and less than 5 at. % metalloids/nonmetals. A work function tuning layer formed of pure metal may be referred to as a "pure work function metal layer." A pure work function metal layer consists essentially of metal elements. Devices with pure work function metal layer(s) have work functions that are close to the edge of their energy band, allowing their threshold voltage to be decreased. Further, pure work function metal layer(s) have a low resistance. Device performance may thus be improved.

In FIGS. 14A and 14B, the gate dielectric layer 112 is formed in the recesses 106. The formation methods of the gate dielectric layer 112 may include molecular-beam deposition (MBD), ALD, PECVD, and the like. The gate dielectric layer 112 wraps around all (e.g., four) sides of the second nanostructures 66. After the gate dielectric layer 112 is formed, portions of the openings 108 remain in the regions 50I between the second nanostructures 66. In the illustrated embodiment, the gate dielectric layer 112 is multi-layered, including a first gate dielectric layer 112A (e.g., an interfacial layer) and a second gate dielectric layer 112B (e.g., a high-k dielectric layer) over the first gate dielectric layer 112A. The first gate dielectric layer 112A may be formed of silicon oxide and the second gate dielectric layer 112B may be formed of hafnium oxide.

In FIGS. 15A and 15B, a work function tuning layer 114A is formed on the gate dielectric layer 112. The work function tuning layer 114A is formed of a pure work function metal such as aluminum, titanium, tungsten, nickel, cobalt, ruthenium, alloys thereof, multi-layers thereof, or the like, which may be conformally deposited by CVD, ALD, PECVD, PEALD, PVD, or the like. The pure work function metal may be any acceptable metal selected to tune a work function of a device to a desired amount given the application of the device to be formed. In the illustrated embodiment, the work function tuning layer 114A is a single continuous layer of a pure work function metal. In other embodiments (subsequently described for FIGS. 20A-21B), the work function tuning layer 114A is a multi-layer of pure work function metals. In some embodiments, the work function tuning layer 114A is composed of aluminum, titanium, hafnium, or alloys thereof, and has less than 5 at. % nitrogen and/or carbon. Forming the work function tuning layer 114A of a pure work function metal allows it to have a lower resistance than work function tuning layers formed of materials that include metalloids/nonmetals, such as work function tuning layers formed of metal nitrides (e.g., titanium nitride, tantalum nitride, etc.) or metal carbides (e.g., titanium carbide, titanium aluminum carbide, etc.). Different work function tuning layers 114A may be formed in each of the regions 50N, 50P by distinct processes, such that the work function tuning layers 114A may be different materials and/or have a different number of layers.

The work function tuning layer 114A in the n-type region 50N may be formed by masking the p-type region 50P. Then, the work function tuning layer 114A in the n-type region 50N is deposited in the recesses 106 in the n-type region 50N. The work function tuning layer 114A in the n-type region 50N may include any acceptable pure work function metal appropriate for n-type devices. For example, the work function tuning layer 114A in the n-type region 50N may be formed of titanium, aluminum, hafnium, or the like.

The work function tuning layer 114A in the p-type region 50P may be formed by masking the n-type region 50N. Then, the work function tuning layer 114A in the p-type region 50P is deposited in the recesses 106 in the p-type region 50P. The work function tuning layer 114A in the p-type region 50P may include any acceptable pure work function metal appropriate for p-type devices. For example, the work function tuning layer 114A in the p-type region 50P may be formed of tungsten, nickel, platinum, or the like.

The work function tuning layer 114A fills the remaining portions of the regions 50I between the second nanostructures 66 (e.g., filling the openings 108, see FIG. 14B). Specifically, the work function tuning layer 114A is deposited on the gate dielectric layer 112 until it is thick enough to merge and seam together. The work function tuning layer 114A can have a thickness in the range of about 2 Å to about 160 Å. In some embodiments, interfaces 118 are formed by the contacting of adjacent portions of the work function tuning layer 114A (e.g., those portions around the second nanostructures 66). Because the work function tuning layer 114A is formed of a pure work function metal, the openings 108 are thus filled by pure metal, and are substantially free of metalloids/nonmetals.

In some embodiments, the work function tuning layer 114A is deposited by CVD. Specifically, the work function tuning layer 114A may be formed by placing the substrate 50 in a deposition chamber and dispensing one or more metal-containing precursor(s) into the deposition chamber so that the metal-containing precursor(s) are flowed over the gate dielectric layer 112. The metal-containing precursor(s) include any precursor for the material of the work function tuning layer 114A. When the work function tuning layer 114A includes aluminum, the metal-containing precursor(s) can include an aluminum-containing precursor such as aluminum chloride ($AlCl_3$), trimethylaluminium ($Al_2Me_6$), or the like. When the work function tuning layer 114A includes titanium, the metal-containing precursor(s) can include a titanium-containing precursor such as titanium chloride ($TiCl_4$), tetrakis(dimethylamino)titanium (TDMAT), or the like. When the work function tuning layer 114A includes hafnium, the metal-containing precursor(s) can include a hafnium-containing precursor such as hafnium chloride ($HfCl_4$), tetrakis(dimethylamino)hafnium (TDMAHf), or the like. During the CVD process, the metal dissociates from the metal-containing precursor(s) to form the material of the work function tuning layer 114A. The metal-containing precursor(s) are kept in the deposition chamber until the work function tuning layer 114A is formed to a desired thickness (previously described). The CVD process can be performed at a temperature in the range of about 20° C. to about 750° C. and at a pressure in the range of about 0.1 Torr to about 500 Torr, such as by maintaining the deposition chamber at a temperature in this range and at a pressure in this range. Performing the CVD process with parameters in these ranges allows the work function tuning layer 114A to be formed to a desired purity. Performing the CVD process with parameters outside of these ranges may not allow the work function tuning layer 114A to be formed to the desired purity.

In some embodiments, the work function tuning layer 114A is deposited by ALD. Specifically, the work function tuning layer 114A may be formed by placing the substrate 50 in a deposition chamber and cyclically dispensing different source precursors into the deposition chamber. The source precursors include the metal-containing precursor(s) previously described and one or more precursor(s) that react with the metal-containing precursor(s) to form the material of the work function tuning layer 114A. An ALD cycle is performed by sequentially dispensing each of the source precursors, with each ALD cycle resulting in the deposition of an atomic layer (sometimes called a monolayer) of the material of the work function tuning layer 114A. The ALD cycles are repeated a number of times until the work function tuning layer 114A is formed to a desired thickness (previously described). The ALD process can be performed at a temperature in the range of about 20° C. to about 750° C. and at a pressure in the range of about 0.1 Torr to about 500 Torr, such as by maintaining the deposition chamber at a temperature in this range and at a pressure in this range. Performing the ALD process with parameters in these ranges allows the work function tuning layer 114A to be formed to a desired purity. Performing the ALD process with parameters outside of these ranges may not allow the work function tuning layer 114A to be formed to the desired purity.

In some embodiments, the work function tuning layer 114A is deposited by a plasma-enhanced deposition process, such as PECVD or PEALD. Specifically, the work function tuning layer 114A may be formed by performing a similar CVD or ALD process as previously described while generating a plasma. The plasma can be generated by flowing a gas source into the deposition chamber, and using a plasma generator to excite the gas source into a plasma state. The gas source includes a carrier gas (such as hydrogen, helium, neon, argon, krypton, xenon, radon, or the like) and the precursor(s) previously described. The gas source can be flowed into the deposition chamber at a rate in the range of about 100 sccm to about 8000 sccm. The plasma generator may be a capacitively coupled plasma (CCP) generator, an inductively coupled plasma (ICP) generator, a remote plasma generator, or the like. Radio frequency (RF) power is generated by the plasma generator to excite the gas source into a plasma state. The plasma generation power can be in the range of about 50 watts to about 5000 watts. Performing the plasma-enhanced deposition process with parameters in these ranges allows the work function tuning layer 114A to be formed to a desired purity. Performing the plasma-enhanced deposition process with parameters outside of these ranges may not allow the work function tuning layer 114A to be formed to the desired purity.

In some embodiments, the work function tuning layer 114A is deposited by PVD. Specifically, the work function tuning layer 114A may be formed by placing the substrate 50 beneath a metal target in a deposition chamber and bombarding the target with ions. The target includes the material of the work function tuning layer 114A, and bombarding the target causes sputtering of the material (e.g., metal atoms) from the target. The target can be bombarded with ions by flowing a gas source into the deposition chamber, and using a plasma generator to excite the gas source into a plasma state. The gas source includes an ion source gas (such as hydrogen, helium, neon, argon, krypton, xenon, radon, or the like). The gas source can be flowed into the deposition chamber at a rate in the range of about 10 sccm to about 8000 sccm. The plasma generator may be a capacitively coupled plasma (CCP) generator, an inductively coupled plasma (ICP) generator, a remote plasma generator, or the like. Radio frequency (RF) power is applied by the plasma generator to the target to activate the ion source gas to a plasma state and bombard the target with ionized gas molecules from the plasma, thus causing metal atoms from the target to be sputtered so that the material of the work function tuning layer 114A is deposited. Each cycle of the applied RF power includes a bombardment cycle (where the target is bombarded with ions) and a cleaning cycle (where electrons are attracted to the target to clean it of ion buildup). The plasma generation power can be in the range of about 50 watts to about 5000 watts. The PVD process can be performed at a temperature in the range of about 20° C. to about 750° C. and at a pressure in the range of about $10^{-7}$ Torr to about 500 Torr, such as by maintaining the deposition chamber at a temperature in this range and at a pressure in this range. Performing the PVD process with parameters in these ranges allows the work function tuning layer 114A to be formed to a desired purity. Performing the PVD process with parameters outside of these ranges may not allow the work function tuning layer 114A to be formed to the desired purity.

Optionally, forming the work function tuning layer 114A includes applying a purification treatment 120 to the material of the work function tuning layer 114A. The purification treatment 120 decreases the concentration of non-metal element(s) (e.g., metalloids/nonmetals) in the material of the work function tuning layer 114A, thereby increasing the concentration of metal element(s) in the material of the work function tuning layer 114A. In some embodiments, if the material of the work function tuning layer 114A that is initially deposited does not have a desired purity, the purification treatment 120 is performed until the material of the work function tuning layer 114A has the desired purity. For example, the material of the work function tuning layer 114A may have a composition of greater than 5 at. % metalloids/nonmetals before the purification treatment 120, and a composition of less than 5 at. % metalloids/nonmetals after the purification treatment 120.

In some embodiments, the purification treatment 120 is a thermal treatment. The thermal treatment can be performed by annealing the work function tuning layer 114A. Annealing the work function tuning layer 114A may cause outgassing of non-metal atoms (e.g., metalloids/nonmetals) from the material of the work function tuning layer 114A. The anneal can be performed at a temperature in the range of about 25° C. to about 1000° C.

In some embodiments, the purification treatment 120 is a plasma treatment. The plasma treatment can be performed by bombarding the work function tuning layer 114A with ions in a chamber. Bombarding the work function tuning layer 114A with ions may cause non-metal atoms (e.g., metalloids/nonmetals) to be sputtered out of the material of the work function tuning layer 114A. The work function tuning layer 114A can be bombarded with ions by flowing a gas source into the chamber, and using a plasma generator to excite the gas source into a plasma state. The gas source includes an ion source gas (such as hydrogen, helium, neon, argon, krypton, xenon, radon, or the like). The gas source can be flowed into the chamber at a rate in the range of about 100 sccm to about 8000 sccm. The plasma generator may be a capacitively coupled plasma (CCP) generator, an inductively coupled plasma (ICP) generator, a remote plasma generator, or the like. Radio frequency (RF) power is applied by the plasma generator to the work function tuning layer 114A to activate the ion source gas to a plasma state and bombard the work function tuning layer 114A with ionized gas molecules from the plasma, thus causing non-metal atoms (e.g., metalloids/nonmetals) to be sputtered out of the material of the work function tuning layer 114A. Each cycle of the applied RF power includes a bombardment cycle (where the work function tuning layer 114A is bombarded with ions) and a cleaning cycle (where electrons are attracted to the work function tuning layer 114A to clean it of ion buildup). The plasma generation power can be in the range of about 50 watts to about 5000 watts.

In some embodiments, the purification treatment 120 is a chemical treatment. The chemical treatment can be performed by exposing the work function tuning layer 114A to a reduction chemical that is capable of reducing the material of the work function tuning layer 114A. Reducing the work function tuning layer 114A may eliminate non-metal atoms (e.g., metalloids/nonmetals) from the material of the work function tuning layer 114A. The reduction chemical can be a metal hydride (such as aluminum hydride, sodium hydride, lithium hydride, or the like), hydrogen, or the like, and can be in a gaseous, liquid, or solid state. The reduction can be performed at a temperature in the range of about 25° C. to about 1000° C.

In FIGS. 16A and 16B, the remaining portions of the gate electrode layers 114 are deposited to fill the remaining portions of the recesses 106. Specifically, a fill layer 114C is deposited on the work function tuning layer 114A. Optionally, an adhesion layer 114B is formed between the fill layer 114C and the work function tuning layer 114A. After formation is complete, the gate electrode layers 114 include the work function tuning layer 114A, the adhesion layer 114B, and the fill layer 114C.

The adhesion layer 114B may be deposited conformally on the work function tuning layer 114A. The adhesion layer 114B may be formed of a conductive material such as titanium nitride, tantalum nitride, titanium carbide, tantalum carbide, or the like, which may be deposited by CVD, ALD, PECVD, PVD, or the like. In some embodiments, the adhesion layer 114B is formed of an impure adhesion metal, such as a metal nitride or a metal carbide, and thus is not a pure metal. The adhesion layer 114B may alternately be referred to as a glue layer and improves adhesion between the work function tuning layer 114A and the fill layer 114C.

The fill layer 114C may be deposited conformally on the adhesion layer 114B. In some embodiments, the fill layer 114C may be formed of a conductive material such as cobalt, ruthenium, aluminum, tungsten, combinations thereof, or the like, which may be deposited by CVD, ALD, PECVD, PVD, or the like. In some embodiments, the fill layer 114C is formed of a pure fill metal that is substantially free of metalloids/nonmetals. The fill layer 114C may be formed of metal(s) that are selected from the same group of candidate metals of the work function tuning layer 114A, which may be formed using methods that are selected from the same group of candidate methods for forming the metals of the work function tuning layer 114A. In some embodiments, the pure fill metal of the fill layer 114C is different from the work function metal of the work function tuning layer 114A. The fill layer 114C fills the remaining portions of the recesses 106.

The regions 50I between the second nanostructures 66 are completely filled by the dielectric material(s) of the gate dielectric layer 112 and the pure work function metal of the work function tuning layer 114A. The adhesion layer 114B (if present) and the fill layer 114C are not formed in the regions 50I between the second nanostructures 66, such that the regions 50I are free of the adhesion layer 114B and the fill layer 114C. Rather, portions of the gate dielectric layer 112 are wrapped around the second nanostructures 66, and the portions of the work function tuning layer 114A between the second nanostructures 66 extend continuously between those portions of the gate dielectric layer 112. Because the work function tuning layer 114A is formed of a pure work function metal, the portions of the gate electrode layers 114 in the regions 50I (e.g., between the second nanostructures 66) include metal and are substantially free of metalloids/ nonmetals.

As noted above, the work function tuning layer 114A and the fill layer 114C can be formed of pure metals while the adhesion layer 114B is formed of an impure metal. In such embodiments, the material of the adhesion layer 114B has a greater concentration of impurities (e.g., metalloids/nonmetals) than the materials of the work function tuning layer 114A and the fill layer 114C. For example, the adhesion layer 114B can be formed of a metal nitride or a metal carbide while the work function tuning layer 114A and the fill layer 114C are substantially free of nitrogen and/or carbon.

Figure 17B:
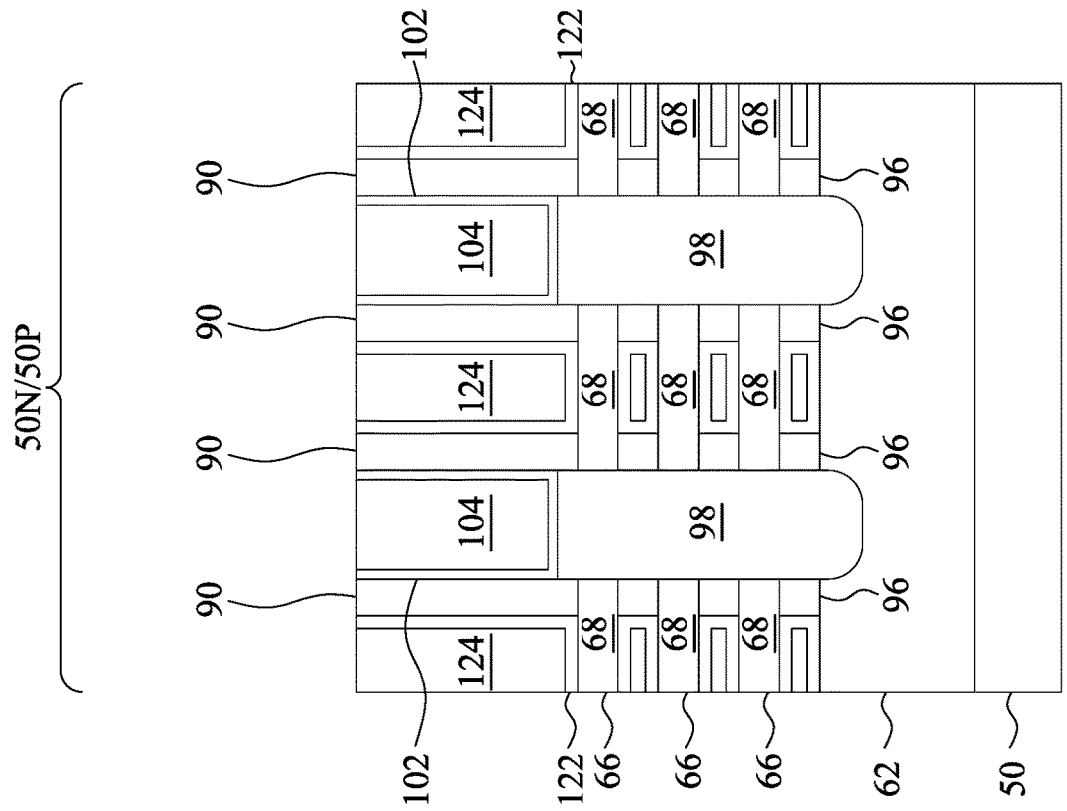
Figure 17A:
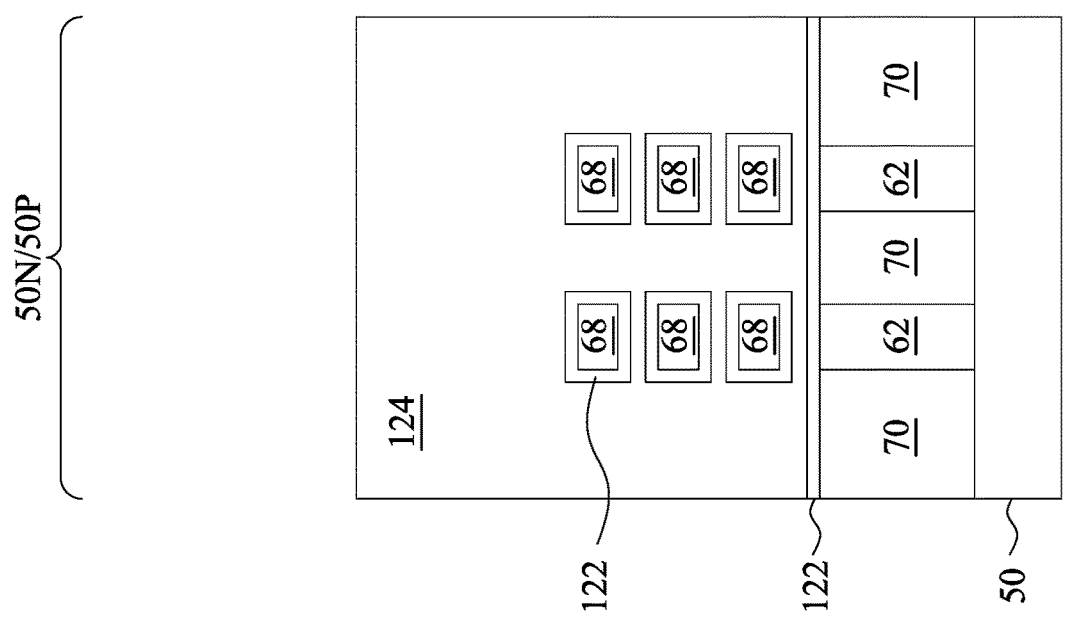

In FIGS. 17A and 17B, a removal process is performed to remove the excess portions of the materials of the gate dielectric layer 112 and the gate electrode layer 114, which excess portions are over the top surfaces of the first ILD 104 and the gate spacers 90, thereby forming gate dielectrics 122 and gate electrodes 124. In some embodiments, a planarization process such as a chemical mechanical polish (CMP), an etch-back process, combinations thereof, or the like may be utilized. The gate dielectric layer 112, when planarized, has portions left in the recesses 106 (thus forming the gate dielectrics 122). The gate electrode layer 114, when planarized, has portions left in the recesses 106 (thus forming the gate electrodes 124). The top surfaces of the gate spacers 90; the CESL 102; the first ILD 104; the gate dielectrics 122 (e.g., the first gate dielectric layers 112A and the second gate dielectric layers 112B, see FIGS. 16A and 16B); and the gate electrodes 124 (e.g., the work function tuning layer 114A, the adhesion layer 114B (if present), and the fill layer 114C, see FIGS. 16A and 16B) are coplanar (within process variations). The gate dielectrics 122 and the gate electrodes 124 form replacement gates of the resulting nano-FETs. Each respective pair of a gate dielectric 122 and a gate electrode 124 may be collectively referred to as a "gate structure." The gate structures each extend along top surfaces, sidewalls, and bottom surfaces of a channel region 68 of the second nanostructures 66.

Figure 18B:
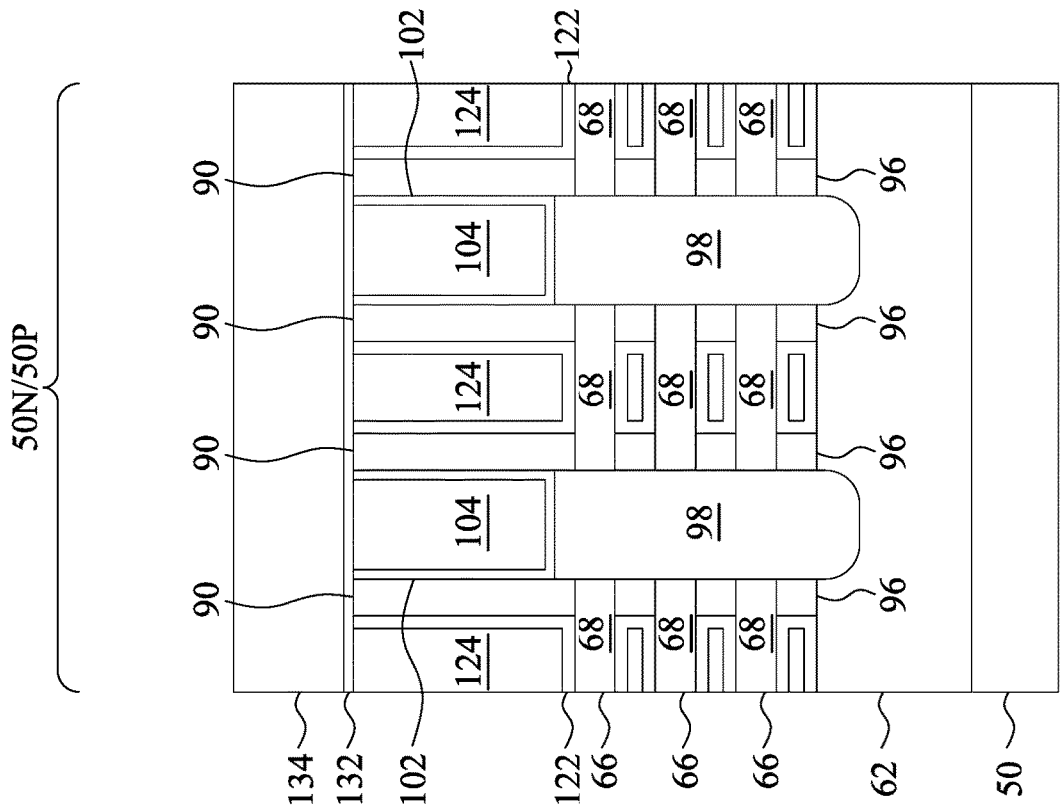
Figure 18A:
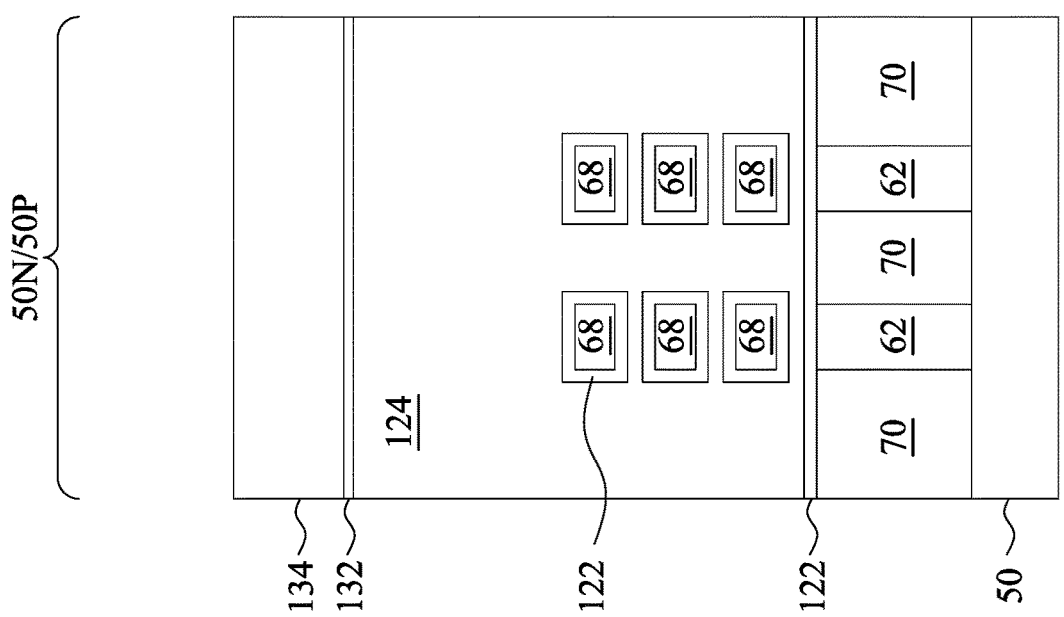

In FIGS. 18A and 18B, a second ILD 134 is deposited over the gate spacers 90, the CESL 102, the first ILD 104, the gate dielectrics 122, and the gate electrodes 124. In some embodiments, the second ILD 134 is a flowable film formed by a flowable CVD method. In some embodiments, the second ILD 134 is formed of a dielectric material such as PSG, BSG, BPSG, USG, or the like, which may be deposited by any suitable method, such as CVD, PECVD, or the like.

In some embodiments, an etch stop layer (ESL) 132 is formed between the second ILD 134 and the gate spacers 90, the CESL 102, the first ILD 104, the gate dielectrics 122, and the gate electrodes 124. The ESL 132 may include a dielectric material, such as, silicon nitride, silicon oxide, silicon oxynitride, or the like, having a high etching selectivity from the etching of the second ILD 134.

Figure 19B:
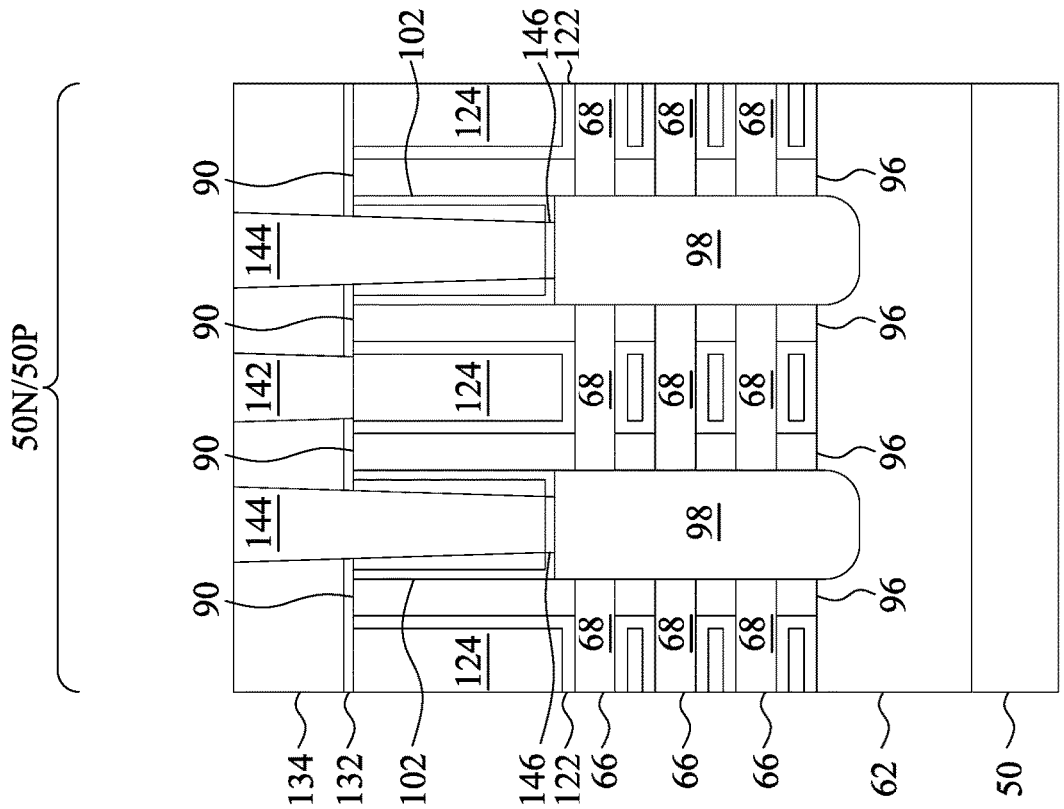
Figure 19A:
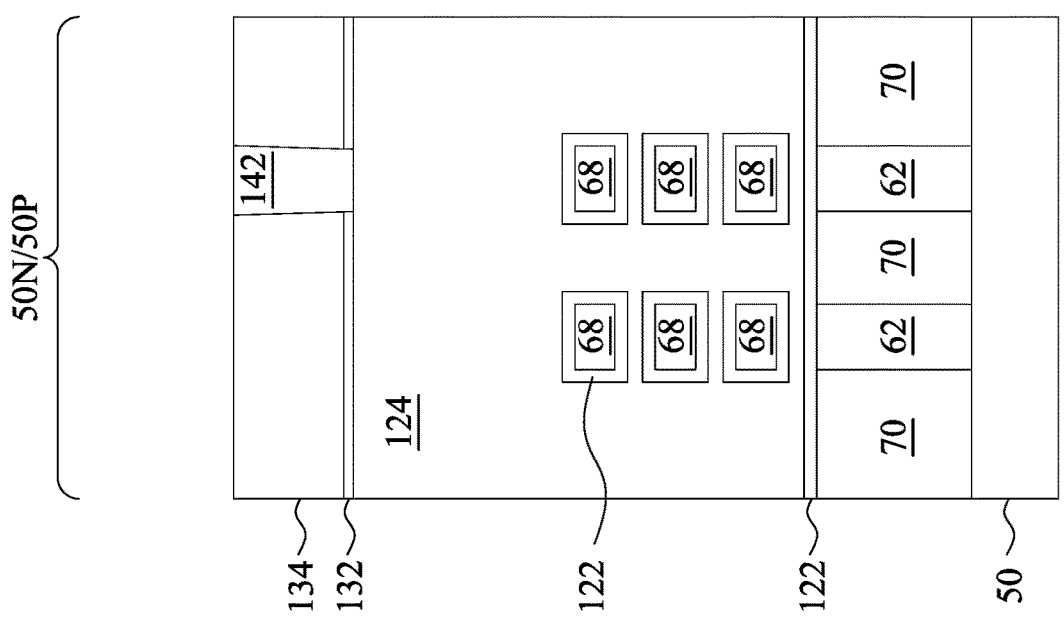

In FIGS. 19A and 19B, gate contacts 142 and source/drain contacts 144 are formed to contact, respectively, the gate electrodes 124 and the epitaxial source/drain regions 98. The gate contacts 142 are physically and electrically coupled to the gate electrodes 124. The source/drain contacts 144 are physically and electrically coupled to the epitaxial source/ drain regions 98.

As an example to form the gate contacts 142 and the source/drain contacts 144, openings for the gate contacts 142 are formed through the second ILD 134 and the ESL 132, and openings for the source/drain contacts 144 are formed through the second ILD 134, the ESL 132, the first ILD 104, and the CESL 102. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 134. The remaining liner and conductive material form the gate contacts 142 and the source/drain contacts 144 in the openings. The gate contacts 142 and the source/drain contacts 144 may be formed in distinct processes, or may be formed in the same process. Although shown as being formed in the same cross-sections, it should be appreciated that each of the gate contacts 142 and the source/drain contacts 144 may be formed in different cross-sections, which may avoid shorting of the contacts.

Optionally, metal-semiconductor alloy regions 146 are formed at the interfaces between the epitaxial source/drain regions 98 and the source/drain contacts 144. The metal-semiconductor alloy regions 146 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 146 can be formed before the material(s) of the source/drain contacts 144 by depositing a metal in the openings for the source/ drain contacts 144 and then performing a thermal anneal process. The metal can be any metal capable of reacting with the semiconductor materials (e.g., silicon, silicon-germanium, germanium, etc.) of the epitaxial source/drain regions 98 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 144, such as from surfaces of the metal-semiconductor alloy regions 146. The material(s) of the source/drain contacts 144 can then be formed on the metal-semiconductor alloy regions 146.

Figure 20B:
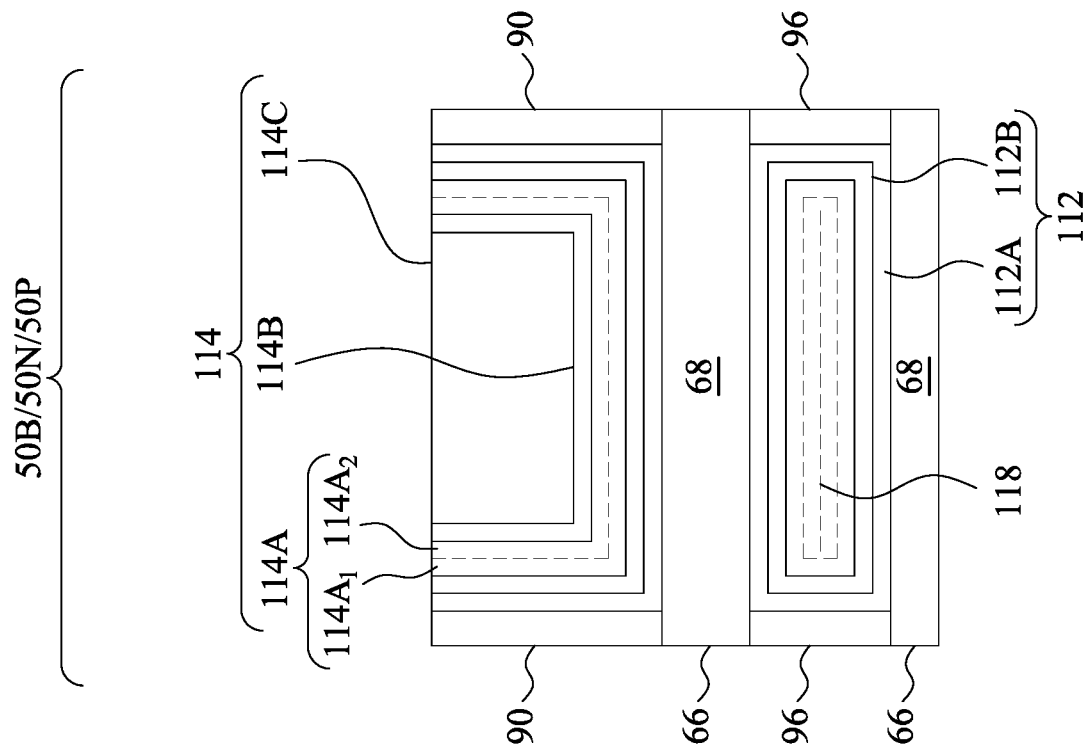
FIGS. 20A, 20B, 21A, and 21B are views of nano-FETs, in accordance with some other embodiments.
Figure 20A:
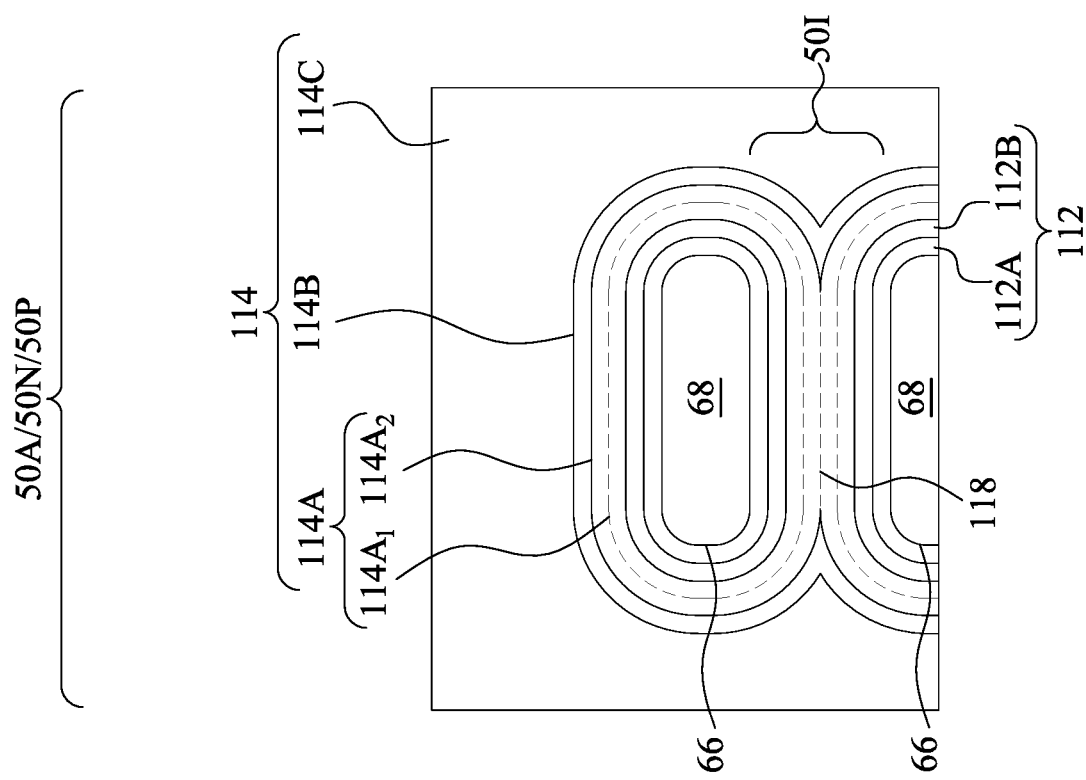
Figure 21B:
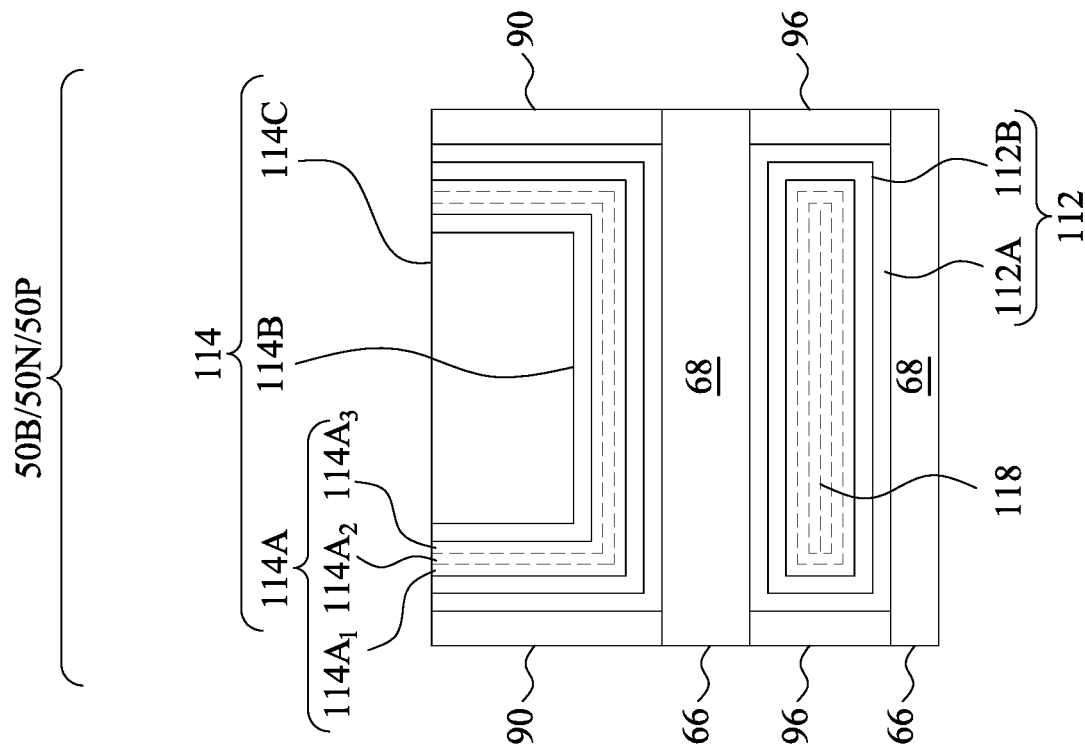
Figure 21A:
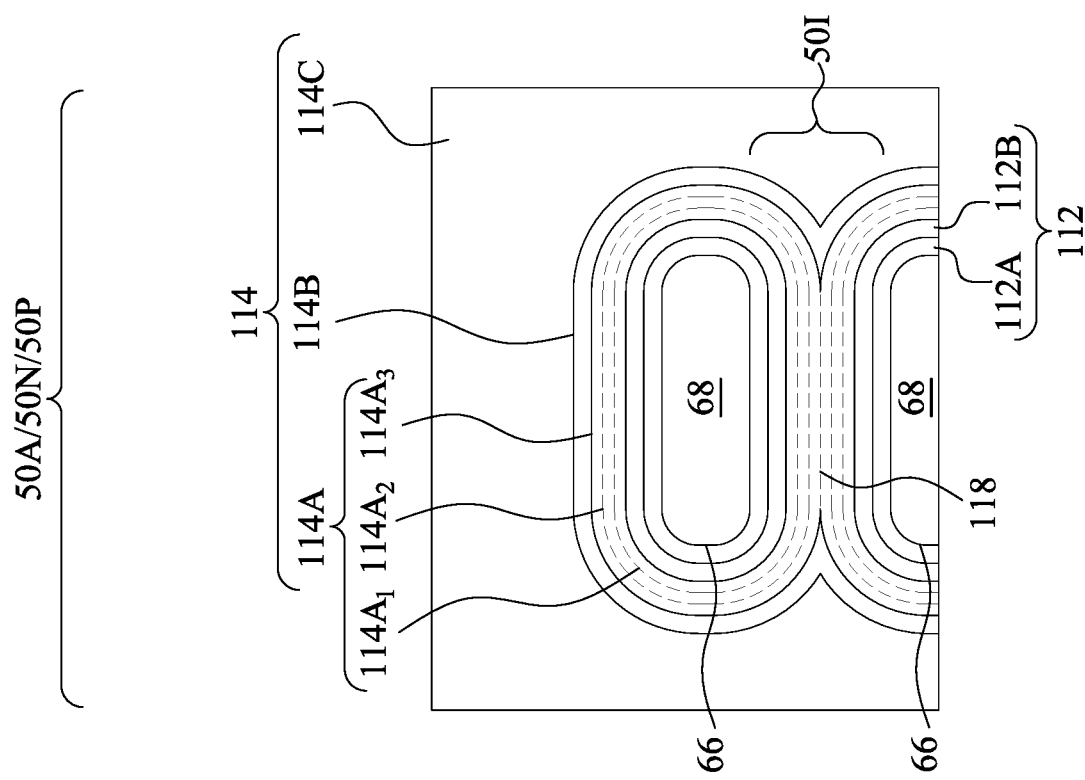

FIGS. 20A-21B are views of nano-FETs, in accordance with some other embodiments. These embodiments are similar to the embodiment described for FIGS. 14A-16B, except the work function tuning layer 114A is a multi-layer of pure work function metals. In some embodiments, the work function tuning layer 114A is a bi-layer of pure work function metals, including a first work function metal sub-layer $114A_1$ and a second work function metal sub-layer $114A_2$ on the first work function metal sub-layer $114A_1$, as illustrated by FIGS. 20A and 20B. In some embodiments, the work function tuning layer 114A is a tri-layer of pure work function metals, which is similar to a bi-layer but further includes a third work function metal sub-layer $114A_3$ on the second work function metal sub-layer $114A_2$, as illustrated by FIGS. 21A and 21B. Each of the sub-layers is a single continuous layer of a different pure work function metal. For example, the first work function metal sub-layer $114A_1$ can be aluminum, the second work function metal sub-layer $114A_2$ can be titanium, and the third work function metal sub-layer $114A_3$ (if present) can be hafnium.

When the work function tuning layer 114A is a multi-layer of pure work function metals, the sub-layers of pure work function metals are deposited so that the uppermost sub-layer of the work function tuning layer 114A (e.g., the third work function metal sub-layer $114A_3$ (if present) or the second work function metal sub-layer $114A_2$) merges and seams together. For example, the uppermost sub-layer of the work function tuning layer 114A may have a greater thickness than each of the underlying sub-layers of the work function tuning layer 114A (e.g., the second work function metal sub-layer $114A_2$ and/or the first work function metal sub-layer $114A_1$), which can prevent merging of the underlying sub-layers.

In some embodiments, the sub-layers of the work function tuning layer 114A have indiscernible interfaces including alloys of their respective metals. Continuing the example where the first work function metal sub-layer $114A_1$ is aluminum, the second work function metal sub-layer $114A_2$ is titanium, and the third work function metal sub-layer $114A_3$ (if present) is hafnium, the interface between the work function metal sub-layers $114A_1$, $114A_2$ can be an indiscernible interface including an aluminum-titanium alloy, and the interface between the work function metal sub-layers $114A_2$, $114A_3$ (if present) can be an indiscernible interface including a titanium-hafnium alloy.

In some embodiments, the sub-layers of the work function tuning layer 114A have discernible interfaces, which are substantially free of alloys of their respective metals. Continuing the example where the first work function metal sub-layer $114A_1$ is aluminum, the second work function metal sub-layer $114A_2$ is titanium, and the third work function metal sub-layer $114A_3$ (if present) is hafnium, the interface between the work function metal sub-layers $114A_1$, $114A_2$ can be a discernible interface of aluminum and titanium, and the interface between the work function metal sub-layers $114A_2$, $114A_3$ (if present) can be a discernible interface of titanium and hafnium.

Embodiments may achieve advantages. Performing the deposition processes described herein allows the work function tuning layers 114A to be formed of pure work function metal(s). Performing the purification treatment 120 allows the purity of the metal of the work function tuning layers 114A to be increased. Forming the gate electrodes 124 with work function tuning layers 114A of pure work function metal(s) allows the resulting devices to have work functions that are close to the edge of their energy band, allowing the threshold voltage of the resulting devices to be decreased. Further, work function tuning layers 114A formed of pure work function metal(s) have a low resistance. Device performance may thus be improved.

In an embodiment, a device includes: a first nanostructure; a second nanostructure; a gate dielectric around the first nanostructure and the second nanostructure, the gate dielectric including dielectric materials; and a gate electrode including: a work function tuning layer on the gate dielectric, the work function tuning layer including a pure work function metal, the pure work function metal of the work function tuning layer and the dielectric materials of the gate dielectric completely filling a region between the first nanostructure and the second nanostructure, the pure work function metal having a composition of greater than 95 at. % metals; an adhesion layer on the work function tuning layer; and a fill layer on the adhesion layer. In some embodiments of the device, the work function tuning layer is a single layer of the pure work function metal. In some embodiments of the device, the work function tuning layer is a multi-layer of pure work function metals. In some embodiments of the device, respective metals of the pure work function metals have interfaces including alloys of the respective metals. In some embodiments of the device, respective metals of the pure work function metals have interfaces free of alloys of the respective metals. In some embodiments of the device, the adhesion layer includes an impure metal and the fill layer includes a fill metal, the impure metal of the adhesion layer having a greater concentration of metalloids and nonmetals than the fill metal of the fill layer and the pure work function metal of the work function tuning layer. In some embodiments of the device, the fill metal is tungsten, the impure metal is a metal nitride or a metal carbide, and the pure work function metal is pure aluminum, pure titanium, or pure hafnium.

In an embodiment, a device includes: a channel region on a substrate; a gate dielectric layer on the channel region; a work function metal on the gate dielectric layer, the work function metal having a first concentration of impurities, the impurities including metalloids or nonmetals; an adhesion metal on the work function metal, the adhesion metal having a second concentration of the impurities, the second concentration greater than the first concentration; and a fill metal on the adhesion metal, the fill metal different from the work function metal, the fill metal having a third concentration of the impurities, the second concentration being greater than the third concentration. In some embodiments of the device, the impurities are nitrogen or carbon. In some embodiments of the device, the first concentration and the third concentration are each less than 5 at. %.

In an embodiment, a method includes: forming a first nanostructure and a second nanostructure on a substrate; forming a gate dielectric layer having a first portion around the first nanostructure and having a second portion around the second nanostructure; depositing a pure work function metal on the gate dielectric layer, the pure work function metal extending continuously between the first portion of the gate dielectric layer and the second portion the gate dielectric layer; depositing an impure adhesion metal on the pure work function metal; and depositing a pure fill metal on the impure adhesion metal. In some embodiments of the method, depositing the pure work function metal includes: placing the substrate in a chamber; and flowing a precursor on the gate dielectric layer, the precursor including the pure work function metal, the chamber maintained at a temperature in a range of 20° C. to 750° C. and at a pressure in a range of 0.1 Torr to 500 Torr during the flowing. In some embodiments of the method, depositing the pure work function metal includes: placing the substrate in a chamber;

performing a cycle including: flowing a first precursor on the gate dielectric layer, the first precursor including the pure work function metal; and flowing a second precursor on the gate dielectric layer, the second precursor reacting with the first precursor to deposit the pure work function metal, the chamber maintained at a temperature in a range of 20° C. to 750° C. and at a pressure in a range of 0.1 Torr to 500 Torr during the cycle; and repeating the cycle a number of times. In some embodiments of the method, depositing the pure work function metal includes: placing the substrate beneath a target including the pure work function metal; and bombarding the target with ions, the pure work function metal sputtered from the target onto the gate dielectric layer during the bombarding. In some embodiments, the method further includes: applying a purification treatment to the pure work function metal, the purification treatment reducing a concentration of impurities in the pure work function metal, the impurities including metalloids or nonmetals. In some embodiments of the method, applying the purification treatment includes: annealing the pure work function metal. In some embodiments of the method, applying the purification treatment includes: generating a plasma; and bombarding the pure work function metal with ions from the plasma. In some embodiments of the method, applying the purification treatment includes: exposing the pure work function metal to a reduction chemical, the reduction chemical including hydrogen or a metal hydride. In some embodiments of the method, the impure adhesion metal has a greater concentration of impurities than the pure work function metal, the impurities including metalloids or nonmetals. In some embodiments of the method, the impure adhesion metal is a metal nitride or a metal carbide, and the pure work function metal is pure aluminum, pure titanium, or pure hafnium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first nanostructure;
   a second nanostructure;
   a gate dielectric around the first nanostructure and the second nanostructure; and
   a gate electrode comprising:
      a work function tuning layer on the gate dielectric, the work function tuning layer and the gate dielectric completely filling a region between the first nanostructure and the second nanostructure, the work function tuning layer comprising a multi-layer of pure work function metals, an upper one of the pure work function metals having a different thickness than a lower one of the pure work function metals;
      an adhesion layer on the work function tuning layer; and
      a fill layer on the adhesion layer.

2. The device of claim 1, wherein respective metals of the pure work function metals have interfaces comprising alloys of the respective metals.

3. The device of claim 1, wherein respective metals of the pure work function metals have interfaces free of alloys of the respective metals.

4. The device of claim 1, wherein the adhesion layer comprises an impure metal and the fill layer comprises a fill metal, the impure metal of the adhesion layer having a greater concentration of metalloids and nonmetals than the fill metal of the fill layer and the pure work function metals of the work function tuning layer.

5. The device of claim 1, further comprising:
   an n-type source/drain region adjacent the first nanostructure and the second nanostructure, the work function tuning layer comprising pure titanium, pure aluminum, or pure hafnium.

6. The device of claim 1, further comprising:
   a p-type source/drain region adjacent the first nanostructure and the second nanostructure, the work function tuning layer comprising pure tungsten, pure nickel, or pure platinum.

7. The device of claim 1, wherein the upper one of the pure work function metals has a first portion around the first nanostructure and has a second portion around the second nanostructure, the first portion and the second portion contacting to form an interface.

8. A device comprising:
   a channel region;
   a gate dielectric on the channel region;
   a first work function metal on the gate dielectric, the first work function metal having a first concentration of non-metal elements;
   a second work function metal on the first work function metal, the second work function metal different from the first work function metal, the second work function metal having a different thickness than the first work function metal, the second work function metal having a second concentration of the non-metal elements;
   an adhesion metal on the second work function metal, the adhesion metal having a third concentration of the non-metal elements, the third concentration greater than the first concentration and the second concentration; and
   a fill metal on the adhesion metal.

9. The device of claim 8, wherein an interface of the first work function metal and the second work function metal is free of an alloy of the first work function metal and the second work function metal.

10. The device of claim 8, wherein an interface of the first work function metal and the second work function metal comprises an alloy of the first work function metal and the second work function metal.

11. The device of claim 8, wherein the first work function metal comprises titanium, aluminum, or hafnium, and the second work function metal comprises titanium, aluminum, or hafnium.

12. The device of claim 8, wherein the first work function metal comprises tungsten, nickel, or platinum, and the second work function metal comprises tungsten, nickel, or platinum.

13. A method comprising:
   forming a first nanostructure and a second nanostructure;
   forming a gate dielectric having a first portion around the first nanostructure and having a second portion around the second nanostructure;
   depositing one or more work function metals over the gate dielectric, the work function metals completely filling an opening between the first portion of the gate dielectric and the second portion of the gate dielectric, the work function metals comprising impurities, the impurities comprising metalloids or nonmetals;

applying a purification treatment to the work function metals, the purification treatment reducing a first concentration of the impurities in the work function metals;

after applying the purification treatment to the work function metals, depositing an adhesion metal over the work function metals, the adhesion metal comprising the impurities; and depositing a fill metal over the adhesion metal.

14. The method of claim 13, wherein a second concentration of the impurities in the adhesion metal is less than the first concentration.

15. The method of claim 13, wherein the impurities are nitrogen or carbon.

16. The method of claim 13, wherein the purification treatment comprises:

annealing the work function metals.

17. The method of claim 13, wherein the purification treatment comprises:

bombarding the work function metals with ions.

18. The method of claim 13, wherein the purification treatment comprises:

exposing the work function metals to a reduction chemical, the reduction chemical comprising hydrogen or a metal hydride.

19. The method of claim 13, wherein the one or more work function metals are a single layer of pure work function metal.

20. The method of claim 13, wherein the one or more work function metals are a multi-layer of different pure work function metals.

\* \* \* \* \*